US012676587B2

(12) United States Patent
Bhattacharjee

(10) Patent No.: US 12,676,587 B2
(45) Date of Patent: *Jul. 7, 2026

(54) PLATE WAVE DEVICES WITH WAVE CONFINEMENT STRUCTURES AND FABRICATION METHODS

(71) Applicant: QORVO US, INC., Greensboro, NC (US)

(72) Inventor: Kushal Bhattacharjee, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 592 days.

This patent is subject to a terminal disclaimer.

(21) Appl. No.: 18/148,635

(22) Filed: Dec. 30, 2022

(65) Prior Publication Data

US 2023/0134688 A1 May 4, 2023

Related U.S. Application Data

(63) Continuation of application No. 16/544,279, filed on Aug. 19, 2019, now Pat. No. 11,545,955, which is a
(Continued)

(51) Int. Cl.
*H03H 9/02* (2006.01)
*H03H 3/02* (2006.01)
(Continued)

(52) U.S. Cl.
CPC .......... *H03H 9/02244* (2013.01); *H03H 3/02* (2013.01); *H03H 9/02228* (2013.01);
(Continued)

(58) Field of Classification Search
CPC .. H03H 9/02244; H03H 3/02; H03H 9/02228; H03H 9/02275; H03H 9/02574;
(Continued)

(56) References Cited

U.S. PATENT DOCUMENTS 5,565,725 A 10/1996 Nakahata et al.
7,262,676 B2 8/2007 Ruile et al.
(Continued)

FOREIGN PATENT DOCUMENTS

CN 101034880 A 9/2007
CN 102089970 A 6/2011
(Continued)

OTHER PUBLICATIONS

Baron, Thomas et al., "Wideband Lithium Niobate FBAR Filters," International Journal of Microwave Science and Technology, vol. 2013, 2013, 6 pages.
(Continued)

*Primary Examiner* — Thomas J Hong
*Assistant Examiner* — Jose K Abraham
(74) *Attorney, Agent, or Firm* — Withrow & Terranova, P.L.L.C.

(57) ABSTRACT

A micro-electrical-mechanical system (MEMS) guided wave device includes a single crystal piezoelectric layer and at least one guided wave confinement structure configured to confine a laterally excited wave in the single crystal piezoelectric layer. A bonded interface is provided between the single crystal piezoelectric layer and at least one underlying layer. A multi-frequency device includes first and second groups of electrodes arranged on or in different thickness regions of a single crystal piezoelectric layer, with at least one guided wave confinement structure. Segments of a segmented piezoelectric layer and a segmented layer of electrodes are substantially registered in a device including at least one guided wave confinement structure.

15 Claims, 20 Drawing Sheets

Related U.S. Application Data continuation of application No. 14/973,336, filed on Dec. 17, 2015, now Pat. No. 10,389,332, which is a continuation of application No. PCT/US2015/066424, filed on Dec. 17, 2015.

(60) Provisional application No. 62/093,753, filed on Dec. 18, 2014, provisional application No. 62/093,184, filed on Dec. 17, 2014.

(51) Int. Cl.

| | | |
|---|---|---|
| *H03H 9/25* | (2006.01) | |
| *H10N 30/072* | (2023.01) | |
| *H10N 30/08* | (2023.01) | |
| *H10N 30/87* | (2023.01) | |

(52) U.S. Cl.
CPC .... *H03H 9/02275* (2013.01); *H03H 9/02574* (2013.01); *H03H 9/25* (2013.01); *H10N 30/072* (2023.02); *H10N 30/08* (2023.02); *H10N 30/87* (2023.02); *H03H 2003/027* (2013.01)

(58) Field of Classification Search
CPC .. H03H 9/25; H03H 2003/027; H10N 30/072; H10N 30/08; H10N 30/87
See application file for complete search history.

(56) References Cited

U.S. PATENT DOCUMENTS

| | | | |
|---|---|---|---|
| 7,528,685 B2 | 5/2009 | Tanaka | |
| 7,586,239 B1 | 9/2009 | Li et al. | |
| 7,619,347 B1 | 11/2009 | Bhattacharjee | |
| 7,812,692 B2 | 10/2010 | Ayazi et al. | |
| 7,854,049 B2 | 12/2010 | Yoshino et al. | |
| 7,898,158 B1 | 3/2011 | Li et al. | |
| 7,965,015 B2 | 6/2011 | Tai et al. | |
| 8,035,280 B2 | 10/2011 | Li et al. | |
| 8,278,802 B1 | 10/2012 | Lee et al. | |
| 8,482,184 B2 * | 7/2013 | Goto ................ | H03H 9/02228 |
| | | | 310/313 R |
| 8,490,260 B1 | 7/2013 | Zhgoon et al. | |
| 8,692,630 B2 | 4/2014 | Reinhardt et al. | |
| 9,059,677 B2 | 6/2015 | Reinhardt et al. | |
| 9,117,593 B2 | 8/2015 | Bhattacharjee | |
| 2003/0199105 A1 * | 10/2003 | Kub .................... | H10N 30/072 |
| | | | 438/48 |
| 2007/0057734 A1 * | 3/2007 | Ruby .................... | H03L 1/028 |
| | | | 331/2 |
| 2007/0107522 A1 * | 5/2007 | Oikawa ................ | G01L 9/0025 |
| | | | 73/754 |
| 2007/0188047 A1 | 8/2007 | Tanaka | |
| 2008/0169724 A1 * | 7/2008 | Bhattacharjee .... | H03H 9/02574 |
| | | | 310/313 B |
| 2008/0266024 A1 | 10/2008 | Ruile et al. | |
| 2008/0297281 A1 | 12/2008 | Ayazi et al. | |
| 2010/0327995 A1 | 12/2010 | Reinhardt et al. | |
| 2011/0109196 A1 | 5/2011 | Goto et al. | |
| 2011/0148252 A1 | 6/2011 | Li et al. | |
| 2011/0266918 A1 | 11/2011 | Iwamoto et al. | |
| 2012/0198672 A1 | 8/2012 | Ueda et al. | |
| 2014/0009032 A1 | 1/2014 | Takahashi et al. | |
| 2014/0152146 A1 | 6/2014 | Kimura et al. | |
| 2014/0210314 A1 | 7/2014 | Bhattacharjee et al. | |
| 2015/0288345 A1 | 10/2015 | Bhattacharjee | |
| 2016/0182007 A1 | 6/2016 | Bhattacharjee | |
| 2016/0182008 A1 | 6/2016 | Bhattacharjee | |
| 2016/0182009 A1 | 6/2016 | Bhattacharjee | |
| 2019/0379345 A1 | 12/2019 | Bhattacharjee | |

FOREIGN PATENT DOCUMENTS

| | | | | | |
|---|---|---|---|---|---|
| CN | 103283147 A | 9/2013 | | | |
| EP | 1821406 A2 | 8/2007 | | | |
| EP | 2658122 A1 | 10/2013 | | | |
| JP | S5664509 A | 6/1981 | | | |
| JP | H05304436 A | * | 11/1993 | | |
| JP | 2004187204 A | 7/2004 | | | |
| JP | 2005223610 A | 8/2005 | | | |
| WO | 2008089002 A1 | 7/2008 | | | |
| WO | 2010004741 A1 | 1/2010 | | | |
| WO | 2010077313 A1 | 7/2010 | | | |
| WO | WO-2012086441 A1 | * | 6/2012 | ......... | H03H 9/02574 |

OTHER PUBLICATIONS

Bhattacharjee, K. et al., "Cavityless Wafer Level Packaging of SAW Devices," 2007 IEEE Ultrasonics Symposium, Oct. 28-31, 2007, New York, NY, IEEE, pp. 1886-1889.

Ferrari, Vittorio et al., "Overview of Acoustic-Wave Microsensors," Piezoelectric Transducers and Applications, Springer-Verlag Berlin Heidelberg, 2008, pp. 39-62.

Gong, Songbin et al., "Monolithic Multi-Frequency Wideband RF Filters Using Two-Port Laterally Vibrating Lithium Niobate MEMS Resonators," Journal of Microelectromechanical Systems, vol. 23, No. 5, Oct. 2014, pp. 1188-1197.

Kadota, Michio et al., "Simulation of solidly mounted plate wave resonator with wide bandwidth using 0-th shear horizontal mode in $LiNbO_3$ plate," Japanese Journal of Applied Physics, vol. 54, Jun. 15, 2015, 4 pages.

Koné, I. et al., "Guided acoustic wave resonators using an acoustic Bragg mirror," Applied Physics Letters, vol. 96, No. 223504, Jun. 3, 2010, 3 pages.

Lebrasseur, E. et al., "Design and fabrication of an acoustic bragg mirror for miniaturized quartz resonators," Proceedings of the Acoustics 2012 Nantes Conference, Apr. 23-27, 2012, Nantes, France, pp. 3361-3366.

Lin, Chih-Ming et al., "Two-Port Filters and Resonators on ALN/3C-SIC Plates Utilizing High-Order Lamb Wave Modes," 2013 IEEE International Conference on Micro Electro Mechanical Systems (MEMS), Jan. 20-24, 2013, Taipei, Taiwan, IEEE, pp. 789-792.

Nakahata, H. et al., "SAW resonators of $SiO_2$/ZnO/diamond structure in GHz range," Proceedings of the 2000 IEEE/EIA International Frequency Control Symposium and Exhibition, 2000, IEEE, pp. 315-320.

Olsson III, R.H. et al., "Lamb Wave Micromechanical Resonators Formed in Thin Plates of Lithium Niobate," Solid-State Sensors, Actuators and Microsystems Workshop, Jun. 8-12, 2014, Hilton Head Island, South Carolina, 4 pages.

Rodríguez-Madrid, J. G. et al., "Super-High-Frequency SAW Resonators on AIN/Diamond," IEEE Electron Device Letters, vol. 33, No. 4, Apr. 2012, pp. 495-497.

Suni, T. et al., "Silicon-on-Insulator Wafers with Buried Cavities," Journal of The Electrochemical Society, vol. 153, No. 4, 2006, pp. G299-G303.

Thakar, Vikram et al., "Monolithic implementation of AIN-on-silicon bandpass filters with a high-Q notch within the passband," IEEE International Frequency Control Symposium, Baltimore, MD, May 2012, IEEE, 5 pages.

Zhou, Changjian et al., "Temperature-Compensated High-Frequency Surface Acoustic Wave Device," IEEE Electron Device Letters, vol. 34, No. 12, Dec. 2013, pp. 1572-1574.

International Search Report and Written Opinion for PCT/US2015/066300, mailed Apr. 5, 2016, 18 pages.

Invitation to Pay Additional Fees and Partial International Search Report for PCT/US2015/066424, mailed Apr. 1, 2016, 11 pages.

International Preliminary Report on Patentability for International Patent Application No. PCT/US2015/066300, mailed Jun. 29, 2017, 13 pages.

International Search Report and Written Opinion for PCT/US2015/066424, mailed Jul. 25, 2016, 34 pages.

International Preliminary Report on Patentability for International Patent Application No. PCT/US2015/066424, mailed Jun. 29, 2017, 24 pages.

Ex Parte Quayle Action for U.S. Appl. No. 14/972,929, mailed Nov. 1, 2018, 6 pages.

(56)         References Cited

OTHER PUBLICATIONS

Notice of Allowance for U.S. Appl. No. 14/972,929, mailed Feb. 28, 2019, 8 pages.
Corrected Notice of Allowability for U.S. Appl. No. 14/972,929, mailed Jun. 7, 2019, 5 pages.
Non-Final Office Action for U.S. Appl. No. 14/973,336, mailed Nov. 9, 2018, 7 pages.
Notice of Allowance for U.S. Appl. No. 14/973,336, mailed Apr. 3, 2019, 11 pages.
Notice of Allowance for U.S. Appl. No. 14/973,295, mailed Mar. 25, 2019, 13 pages.
Non-Final Office Action for U.S. Appl. No. 14/973,295, mailed Oct. 5, 2018, 11 pages.
Alam, S., "EIC Search Report," U.S. Appl. No. 16/544,279, filed Mar. 31, 2022, Scientific and Technical Information Center, 16 pages.
Chung, S., "EIC Search Report," U.S. Appl. No. 16/505,775, filed Mar. 30, 2022, Scientific and Technical Information Center, 22 pages.
Cueto, F., "EIC Search Report," U.S. Appl. No. 16/544,279, filed Mar. 30, 2022, Scientific and Technical Information Center, 19 pages.
Huston, E.P., "EIC Search Report," U.S. Appl. No. 16/505,775, filed Apr. 4, 2022, Scientific and Technical Information Center, 14 pages.
First Office Action for Chinese Patent Application No. 201580076411.1, mailed Feb. 3, 2020, 24 pages.
Second Office Action for Chinese Patent Application No. 201580076411.1, mailed Jul. 1, 2020, 8 pages.
Notice of Reasons for Refusal for Japanese Patent Application No. 2017-551574, mailed Jan. 14, 2020, 13 pages.
Notice of Reasons for Refusal for Japanese Patent Application No. 2017-551574, mailed Jun. 30, 2020, 5 pages.
Decision to Grant for Japanese Patent Application No. 2017551574, mailed Oct. 27, 2020, 4 pages.
Notice of Reasons for Rejection for Japanese Patent Application No. 2020195259, mailed Oct. 5, 2021, 6 pages.
Notice of Reasons for Rejection for Japanese Patent Application No. 2020195259, mailed May 10, 2022, 9 pages.
Quayle Action for U.S. Appl. No. 16/505,775, mailed May 3, 2022, 11 pages.
Notice of Allowance for U.S. Appl. No. 16/505,775, mailed Jun. 20, 2022, 8 pages.
Non-Final Office Action for U.S. Appl. No. 16/544,279, mailed Jul. 15, 2022, 16 pages.
Notice of Allowance for U.S. Appl. No. 16/544,279, mailed Sep. 6, 2022, 8 pages.

* cited by examiner 38 40 52

12
14
16

28

38 40 52

12
14
16

28

WAFER BONDING

PLATE WAVE DEVICES WITH WAVE CONFINEMENT STRUCTURES AND FABRICATION METHODS

This application is a continuation of U.S. patent application Ser. No. 16/544,279 filed on Aug. 19, 2019 and issuing as U.S. Pat. No. 11,545,955, which is a continuation of U.S. patent application Ser. No. 14/973,336 filed on Dec. 17, 2015 and issuing as U.S. Pat. No. 10,389,332, which is a continuation of International Patent Application No. PCT/US15/066424 filed on Dec. 17, 2015, which is a non-provisional of U.S. Provisional Patent Application No. 62/093,184 filed on Dec. 17, 2014, and is a non-provisional of U.S. Provisional Patent Application No. 62/093,753 filed on Dec. 18, 2014. The entire contents of the foregoing applications and patent are hereby incorporated by reference as if set forth fully herein.

TECHNICAL FIELD

The present disclosure relates to electromechanical components utilizing acoustic wave propagation in piezoelectric layers, and in particular to improved plate wave structures and methods for making such structures. Such structures may be used, for example, in radio frequency transmission circuits, sensor systems, signal processing systems, and the like.

BACKGROUND

Micro-electrical-mechanical system (MEMS) devices come in a variety of types and are utilized across a broad range of applications. One type of MEMS device that may be used in applications such as radio frequency (RF) circuitry is a MEMS vibrating device (also known as a resonator). A MEMS resonator generally includes a vibrating body in which a piezoelectric layer is in contact with one or more conductive layers. Piezoelectric materials acquire a charge when compressed, twisted, or distorted. This property provides a transducer effect between electrical and mechanical oscillations or vibrations. In a MEMS resonator, an acoustic wave may be excited in a piezoelectric layer in the presence of an alternating electric signal, or propagation of an elastic wave in a piezoelectric material may lead to generation of an electrical signal. Changes in the electrical characteristics of the piezoelectric layer may be utilized by circuitry connected to a MEMS resonator device to perform one or more functions.

Guided wave resonators include MEMS resonator devices in which an acoustic wave is confined in part of a structure, such as in the piezoelectric layer. Confinement may be provided by reflection at a solid/air interface, or by way of an acoustic mirror (e.g., a stack of layers referred to as a Bragg mirror) capable of reflecting acoustic waves. Such confinement may significantly reduce or avoid dissipation of acoustic radiation in a substrate or other carrier structure.

Various types of MEMS resonator devices are known, including devices incorporating interdigital transducer (IDT) electrodes and periodically poled transducers (PPTs) for lateral excitation. Examples of such devices are disclosed in U.S. Pat. Nos. 7,586,239, 7,898,158, and 8,035,280 assigned to RF Micro Devices (Greensboro, NC, USA), wherein the contents of the foregoing patents are hereby incorporated by reference herein. Devices of these types are structurally similar to film bulk acoustic resonator (FBAR) devices, in that they each embody a suspended piezoelectric membrane. Such devices (including IDT-type devices in particular) are subject to limitations of finger resistivity and power handling due to poor thermal conduction in the structures. Additionally, IDT-type and PPT-type membrane devices may require stringent encapsulation, such as hermetic packaging with a near-vacuum environment.

Plate wave (also known as lamb wave) resonator devices are also known, such as described in U.S. Pat. No. 8,692,630 to Reinhardt et al. ("Reinhardt"). Compared to surface acoustic wave (SAW) devices, plate wave resonators may be fabricated atop silicon or other substrates and may be more easily integrated into radio frequency circuits. Reinhardt discloses a multi-frequency plate wave type resonator device including a silicon substrate, a stack of deposited layers (e.g., SiOC, SiN, $SiO_2$, and Mo) constituting a Bragg mirror, a deposited AlN piezoelectric layer, and a SiN passivation layer. According to Reinhardt, at least one resonator includes a differentiation layer arranged to modify the coupling coefficient of the resonator so as to have a determined useful bandwidth. One limitation of Reinhardt's teaching is that deposition of AlN piezoelectric material (e.g., via epitaxy) over an underlying material having a very different lattice structure generally precludes formation of single crystal material; instead, lower quality material with some deviation from perfect orientation is typically produced. A further limitation is that Reinhardt's approach does not appear to be capable of producing resonators of widely different (e.g., octave difference) frequencies on a single substrate. Additionally, in at least certain contexts, it may be cumbersome to produce Bragg mirrors with consistently high reproducibility of layer thicknesses.

Accordingly, there is a need for guided wave devices that can be efficiently manufactured. Desirable devices would address thermal conduction and stringent packaging concerns associated with membrane-type devices. There is a further need to provide devices that may incorporate high quality piezoelectric materials. There is a still further need for devices that may enable production of widely different frequencies on a single substrate.

SUMMARY

The present disclosure provides a micro-electrical-mechanical system (MEMS) guided wave device that utilizes a single crystal piezoelectric layer and at least one guided wave confinement structure configured to confine a laterally excited wave in the single crystal piezoelectric layer. One or multiple guided wave confinement structures may be provided. One guided wave confinement structure may include a Bragg mirror separated from a single crystal piezoelectric layer by a slow wave propagation layer or a temperature compensation layer. Another guided wave confinement structure may include a fast wave propagation material. Single crystal piezoelectric materials (e.g., lithium niobate, lithium tantalate, and the like) may be incorporated in such devices, such as by pre-fabrication followed by bonding to at least one underlying layer of a guided wave device to form a bonded interface. Multiple electrodes arranged in or on the single crystal piezoelectric layer are configured for transduction of a lateral acoustic wave.

Embodiments incorporating fast wave propagation materials to provide guided wave confinement may benefit from ease of fabrication as compared to production of Bragg mirrors in certain contexts. One or more Bragg mirrors may be used in certain embodiments, such as may be useful to tailor wave reflection parameters, and as also may be useful in the context of confining very high velocity acoustic waves. Certain embodiments incorporate a fast wave propagation material on or adjacent to one (e.g., a first) surface of a piezoelectric material, and incorporate a Bragg mirror adjacent to another (e.g., a second) surface of the piezoelectric material.

Guided wave devices incorporating various electrode configurations disclosed herein include, but are not limited to, single layer coplanar interdigital transducers (IDTs) alone, multiple layer coplanar IDTs alone, IDTs in combination with continuous layer electrodes (e.g., useable as floating electrodes or shorting electrodes to enable launch of asymmetric waves), IDTs at least partially embedded in piezoelectric layers, non-coplanar IDTs, IDTs registered with single crystal piezoelectric layer segments, and periodically poled transducers (PPTs). In certain embodiments, electrodes may be partially embedded in, and/or gaps between various electrodes may be filled in whole or in part with, (i) piezoelectric material, or (ii) slow wave propagation material and/or temperature compensation material. The wavelength A of an acoustic wave transduced by an IDT equals two times the pitch or separation distance between adjacent electrodes (fingers) of opposite polarity, and the wavelength A also equals the separation distance between closest electrodes (fingers) of the same polarity.

In certain embodiments, MEMS guided wave devices employ single-sided confinement, in which at least one confinement structure is provided adjacent to a first surface of a single crystal piezoelectric layer, and in which a solid/air interface is provided adjacent to a second opposing surface of the single crystal piezoelectric layer. In other embodiments, MEMS guided wave devices employ double-sided confinement, in which first and second confinement structures are provided proximate to first and second opposing surfaces, respectively, of a single crystal piezoelectric layer.

In one aspect, a MEMS guided wave device includes multiple electrodes arranged in or on a single crystal piezoelectric layer and configured for transduction of a lateral acoustic wave in the single crystal piezoelectric layer. At least one guided wave confinement structure includes a Bragg mirror proximate to the piezoelectric layer, wherein the Bragg mirror is configured to confine a laterally excited wave in the single crystal piezoelectric layer, and the Bragg mirror is separated from the single crystal piezoelectric layer by a slow wave propagation layer. In certain embodiments, the Bragg mirror includes at least one group of at least one low impedance layer and at least one high impedance layer, and the at least one low impedance layer is sequentially arranged with the at least one high impedance layer in the at least one group. In certain embodiments, the laterally excited wave in the single crystal piezoelectric layer has a wavelength A, and each guided wave confinement structure of the at least one guided wave confinement structure comprises a thickness of less than 5λ. In certain embodiments, a bonded interface is provided between the single crystal piezoelectric layer and at least one underlying layer of the device (such as a guided wave confinement structure, or a slow wave propagation layer, or a substrate).

In certain embodiments, a single crystal piezoelectric layer includes a first surface and a second surface opposing the first surface, the at least one guided wave confinement structure includes a first guided wave confinement structure proximate to the first surface and includes a second guided wave confinement structure proximate to the second surface. In certain embodiments, a first guided wave confinement structure includes a first Bragg mirror, and a second guided wave confinement structure includes either a fast wave propagation material or a second Bragg mirror. In certain embodiments, first and second slow wave propagation layers may be provided, with a first slow wave propagation layer arranged between a first surface of the piezoelectric layer and a first guided wave confinement structure, and with a second slow wave propagation layer arranged between a second surface of the piezoelectric layer and a second guided wave confinement structure. In certain embodiments, at least one (or each) slow wave propagation layer includes a thickness that differs from a thickness of each layer of the at least one guided wave confinement structure. In certain embodiments, multiple electrodes are arranged in at least one slow wave propagation layer and in contact with the single crystal piezoelectric layer. In certain embodiments, a first IDT includes a first group of electrodes of a first polarity and a second group of electrodes of a second polarity opposing the first polarity. In certain embodiments, the second group of electrodes may be arranged in a plurality of recessed regions in the piezoelectric layer and are arranged non-coplanar with the first group of electrodes. In certain embodiments, at least one functional layer may be arranged to at least partially cover at least some electrodes. In certain embodiments, a first interdigital transducer (IDT) is arranged on or in (e.g., at least partially embedded in) a first surface of a piezoelectric layer, optionally in combination with a second IDT arranged on or in a second surface of the piezoelectric layer. In certain embodiments, multiple electrodes and a piezoelectric layer in combination embody a periodically poled transducer (PPT), with at least one slow wave propagation layer provided between the PPT and at least one guided wave confinement structure.

In another aspect, a MEMS guided wave device includes multiple electrodes arranged in or on a single crystal piezoelectric layer and configured for transduction of a lateral acoustic wave in the single crystal piezoelectric layer. At least one guided wave confinement structure arranged proximate to the single crystal piezoelectric layer confines a laterally excited wave having a wavelength A in the single crystal piezoelectric layer, wherein each guided wave confinement structure comprises a thickness of less than 5λ. The guided wave device includes at least one of the following features (i) and (ii): (i) the at least one guided wave confinement structure includes a fast wave propagation layer, or (ii) the at least one guided wave confinement structure includes a Bragg mirror, wherein the Bragg mirror is separated from the single crystal piezoelectric layer by a slow wave propagation layer. In certain embodiments, the guided wave device is devoid of contact between the electrodes and at least one (or each) guided wave confinement structure. In certain embodiments, spacing between a guided wave confinement structure and a single crystal piezoelectric layer may be provided with at least one slow wave propagation layer and/or a temperature compensation layer (wherein both utilities may optionally be provided by a single material in appropriate instances), wherein the layer providing such spacing may embody a thickness that differs from a thickness of each layer of the at least one guided wave confinement structure. A bonded interface is preferably arranged between the single crystal piezoelectric layer and at least one underlying layer (such as, but not limited to, (i) a guided wave confinement structure of the at least one guided wave confinement structure or (ii) an optionally provided slow wave propagation layer arranged between the single crystal piezoelectric layer and a guided wave confinement structure of the at least one guided wave confinement structure).

In another aspect, a single crystal piezoelectric layer of a MEMS guided wave device includes differing first and second thickness regions, a first group of electrodes arranged on or adjacent to the first thickness region and configured for transduction of a first lateral acoustic wave having a wavelength $\lambda_1$ in the first thickness region, and a second group of electrodes arranged on or adjacent to the second thickness region and configured for transduction of a second lateral acoustic wave having a wavelength $\lambda_2$ in the second thickness region, wherein $\lambda_1$ differs from $\lambda_2$. The device further includes at least one guided wave confinement structure configured to confine the first lateral acoustic wave in the first thickness region, and configured to confine the second lateral acoustic wave in the second thickness region. In certain embodiments, the at least one guided wave confinement structure includes a fast wave propagation material. In certain embodiments, the at least one guided wave confinement structure includes a Bragg mirror with at least one group of at least one low impedance layer and at least one high impedance layer, wherein the at least one low impedance layer is sequentially arranged with the at least one high impedance layer in the at least one group. In certain embodiments, the Bragg mirror is separated from the single crystal piezoelectric layer by a temperature compensation layer.

In certain embodiments, the first and second groups of electrodes include first and second IDTs, and/or the first and second groups of electrodes are non-coplanar relative to one another. In certain embodiments, at least one temperature compensation layer is provided between the at least one guided wave confinement structure and at least a portion of the piezoelectric layer. Optionally, a temperature compensation layer may include a first temperature compensation layer thickness proximate to the first thickness region of the piezoelectric layer, and may include a second temperature compensation layer thickness proximate to the second thickness region of the piezoelectric layer. In certain embodiments, a temperature compensation layer may also embody a slow wave propagation material.

In certain embodiments, a MEMS guided wave device disclosed herein further includes a carrier substrate having a thickness of greater than 5 times the wavelength $\lambda$ of a laterally excited wave confined in a single crystal piezoelectric layer, with at least one guided wave confinement structure arranged between the carrier substrate and the piezoelectric layer. In certain embodiments, a MEMS guided wave device is solidly mounted to a carrier substrate, or portions of a MEMS guided wave device may be suspended over a carrier substrate and separated by an intervening cavity. In other embodiments, a MEMS guided wave device as disclosed herein is devoid of a carrier substrate.

In another aspect, a MEMS guided wave device includes a segmented single crystal piezoelectric layer with multiple electrodes arranged therein or thereon and configured for transduction of a lateral acoustic wave having a wavelength A in the piezoelectric layer, with the multiple electrodes including a segmented layer of first electrodes. At least one guided wave confinement structure (preferably having a thickness of less than 5λ) is arranged proximate to the segmented piezoelectric layer and configured to confine the lateral acoustic wave in the segmented piezoelectric layer. Additionally, segments of the segmented single crystal piezoelectric layer are substantially registered (e.g., overlapping) with segments of the segmented layer of first electrodes. In certain embodiments, a second electrode (e.g., including a substantially continuous layer, or a discontinuous or segmented layer) is additionally provided, such as along a second surface of the piezoelectric layer that opposes a first surface of the piezoelectric layer in contact with the segmented layer of first electrodes. In certain embodiments, first and second guided wave confinement structures are provided, and gaps between segments of the segmented layer of first electrodes, as well as gaps between segments of the segmented single crystal piezoelectric layer, are filled with a slow wave propagation material and/or a temperature compensation material. In certain embodiments, a layer of slow wave propagation material and/or a temperature compensation material may be provided between (i) the segmented layer of first electrodes and (ii) at least one of the first guided wave confinement structure or the second guided wave confinement structure.

In another aspect, a method of fabricating a micro-electrical-mechanical system (MEMS) guided wave device including a single crystal piezoelectric material with different thickness regions is provided. A single crystal piezoelectric layer is locally thinned to define first and second thickness regions that differ in thickness. The locally thinned piezoelectric layer is bonded on or over an underlying layer (e.g., at least one of (i) a fast wave propagation layer; (ii) a Bragg mirror, or (iii) a substrate) to provide an internally bonded interface. Such bonding may be performed using wafer bonding techniques known in the art. First and second groups of electrodes are defined on or adjacent to the first thickness region and the second thickness region, respectively, for transduction of a first lateral acoustic wave having a first wavelength $\lambda_1$ in the first thickness region, and for transduction of a second lateral acoustic wave having a second wavelength $\lambda_2$ in the second thickness region. In certain embodiments, one or more surfaces of the piezoelectric layer are planarized prior to bonding (e.g., as a bonding preparation step), and/or planarized after bonding (e.g., to adjust thickness of the piezoelectric layer). In certain embodiments, a temperature compensation layer may be provided below the piezoelectric layer, with the temperature compensation layer optionally including a first temperature compensation layer thickness region and a second temperature compensation layer thickness region that differ from one another. In certain embodiments, a temperature compensation material is deposited on or over a surface of at least one of the first thickness region or the second thickness region.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention.

DETAILED DESCRIPTION

Figure 1:
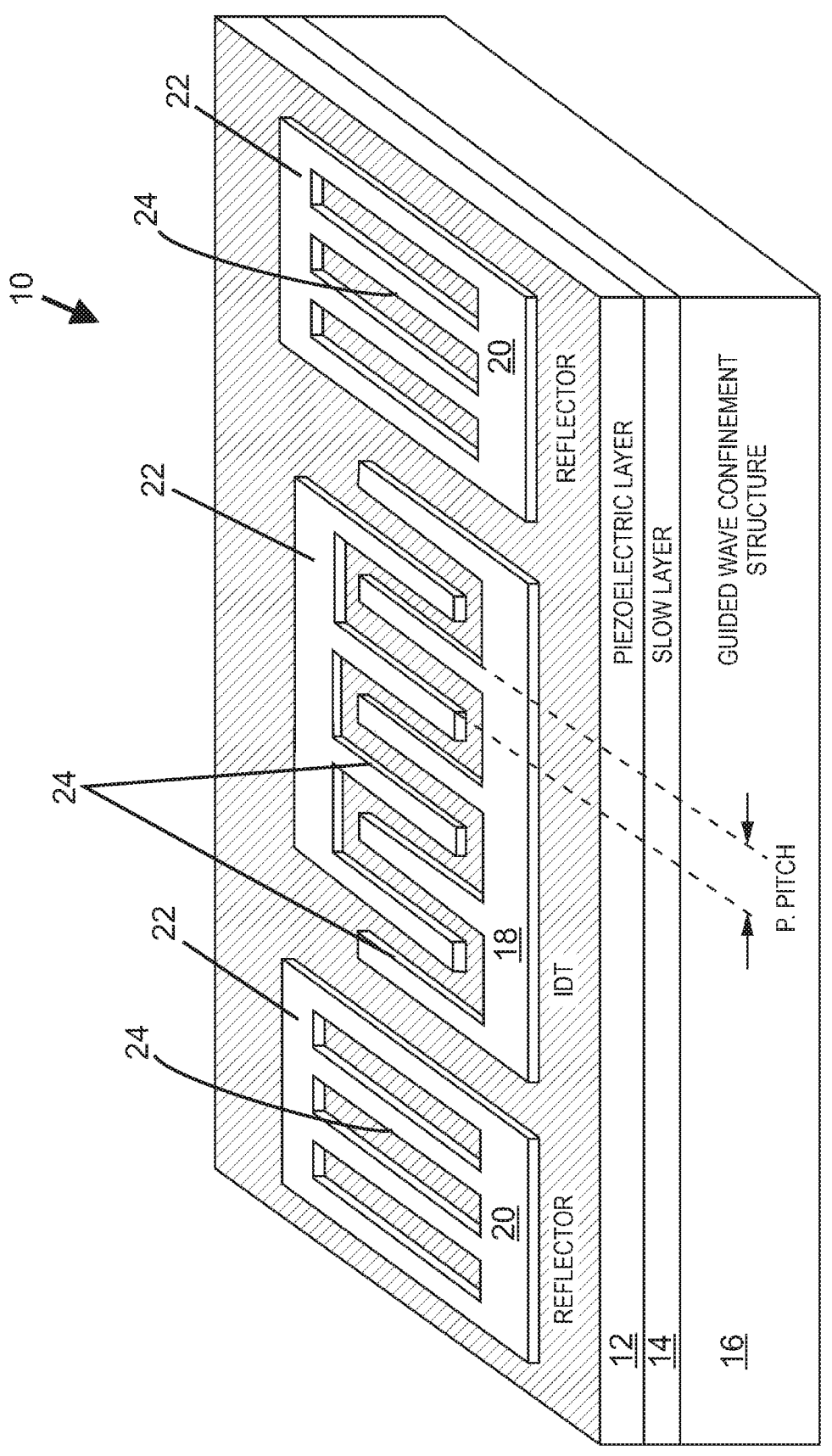
FIG. 1 is a perspective view of a MEMS guided wave device including an IDT and two reflector gratings arranged over a piezoelectric layer, an optional slow wave propagation layer, and a guided wave confinement structure according to one embodiment of the present disclosure.

Embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof. As used herein, the terms "proximate" and "adjacent" as applied to a specified layer or element refers to a state of being close or near to an other layer or element, and encompass the possible presence of one or more intervening layers or elements without necessarily requiring the specified layer or element to be directly on or directly in contact with the other layer or element unless specified to the contrary herein.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in one aspect to a micro-electrical-mechanical system (MEMS) guided wave device that utilizes a single crystal piezoelectric layer and at least one guided wave confinement structure (e.g., a fast wave propagation layer or a Bragg mirror) configured to confine a laterally excited wave in the single crystal piezoelectric layer. Such confinement may significantly reduce or avoid dissipation of acoustic radiation in a substrate or other carrier structure. The MEMS guided wave device may have dominant lateral vibrations. The single crystal piezoelectric layer may include lithium tantalate or lithium niobate, and may provide vibrating structures with precise sizes and shapes, which may provide high accuracy, and (in at least certain embodiments) may enable fabrication of multiple resonators having different resonant frequencies on a single substrate.

Vibrating structures of preferred MEMS guided wave devices described herein are formed of single crystal piezoelectric material and use mechanically efficient MEMS construction. Such vibrating structures may be high-Q, low loss, stable, at a low temperature coefficient of frequency, have a high electromechanical coupling efficient, have high repeatability, and have a low motional impedance. In certain embodiments, a nonstandard (e.g., offcut) crystalline orientation of the single crystal piezoelectric material may be used to provide specific vibrational characteristics, such as a low temperature coefficient of frequency, a high electro-mechanical coupling coefficient, or both. Since it is extremely difficult to grow single crystal piezoelectric material (e.g., via epitaxy) over non-lattice-matched materials, in preferred embodiments, single crystal piezoelectric materials are pre-fabricated (e.g., by growth of a boule followed by formation of thin wafers), surface finished (e.g., via chemical mechanical planarization (CMP) and polishing to provide near-atomic flatness), and bonded to one or more underlying layers—such as may include a guided wave confinement structure that is optionally overlaid with a layer providing slow wave propagation and/or temperature compensation utility, and that is optionally supported by a carrier substrate. Any suitable wafer bonding technique known in the art may be used, such as may rely on van der Waals bonds, hydrogen bonds, covalent bond, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. Such bonding results in formation of a bonded interface between the piezoelectric layer and at least one underlying layer. In certain embodiments, the bonded interface may include at least one intervening layer arranged on at least a portion of (or the entirety of) a surface of the piezoelectric layer. Suitable electrodes may be defined in or on the piezoelectric layer for transduction of at least one lateral acoustic wave therein. One or more additional layers (e.g., one or more layers providing additional (two-sided) guided wave confinement utility, and one or more layers providing slow wave propagation utility) may be further provided over the piezoelectric layer.

In certain embodiments, a composite including a single crystal piezoelectric layer, at least one guided wave confinement structure, and electrodes (optionally in combination with one or more additional layers providing slow wave propagation and/or temperature compensation utility as disclosed herein) is solidly mounted to a carrier substrate. In other embodiments, at least a portion of such a composite may be suspended above a carrier substrate with a gap arranged therebetween. According to preferred embodiments, no portion of a piezoelectric layer is suspended on its own in the absence of at least one additional layer as described herein. In this regard, the present disclosure relates to plate-type or quasi-plate-type guided wave devices suitable for lateral wave propagation, as opposed to membrane-type devices. In certain embodiments, devices described herein may be used for propagation of quasi-shear horizontal waves, quasi-longitudinal waves, and/or thickness-extensional (FBAR-type) waves.

The terms "fast wave propagation material" or "fast wave propagation layer" refers to a material or layer in which an acoustic wave of interest travels more quickly than in a proximate piezoelectric layer in which the acoustic wave is transduced. Similarly, the terms "slow wave propagation material" or "slow wave propagation layer" refers to a material or layer in which an acoustic wave of interest travels more slowly than in a proximate piezoelectric layer in which the acoustic wave is transduced. Examples of fast wave propagation materials that may be used according to certain embodiments include (but are not limited to) diamond, sapphire, aluminum nitride, silicon carbide, boron nitride, and silicon. An example of a slow wave propagation material that may be used according to certain embodiments includes (but is not limited to) silicon dioxide.

Certain embodiments disclosed herein utilize acoustic Bragg mirrors (also known as Bragg reflectors). A Bragg mirror includes at least one group of at least one low impedance layer (e.g., silicon dioxide) and at least one high impedance layer (e.g., tungsten or hafnium dioxide), wherein the at least one low impedance layer is sequentially arranged with the at least one high impedance layer in the at least one group. The number of groups of alternating impedance layers used in a Bragg mirror depends on the total reflection coefficient required.

Single crystal piezoelectric layers as disclosed herein preferably include a thickness of no greater than 2 times the wavelength A (more preferably no greater than 1 times the wavelength, or no greater than 0.5 times the wavelength) of a lateral acoustic wave transduced in the piezoelectric layer. As disclosed herein, a guided wave confinement structure arranged proximate to a single crystal piezoelectric layer preferably includes a thickness of less than 5λ (e.g., within a range of 1λ to 5λ). (Within a Bragg mirror, each layer may include a thickness on the order of roughly 0.25λ to 0.5λ.) If provided, any optional slow wave propagation layers may have individual thicknesses in a range of up to about 1λ, and may preferably be less than about 0.5λ or less than about 0.25λ. In certain embodiments, each slow wave propagation layer may have a thickness of less than a thickness of an adjacent single crystal piezoelectric layer. This preferred guided wave confinement structure thickness is to be contrasted with a carrier substrate that may be provided according to certain embodiments, wherein such a carrier substrate preferably includes a thickness of greater than 5λ (or five times the greatest wavelength in embodiments in which multiple resonators of different frequencies are provided in a single guided wave device). In alternative embodiments applicable to any structures described herein, however, a fast layer may have a thickness of greater than 5λ, and may embody a substrate of any necessary or desired thickness.

When provided, at least one functional layer (e.g., providing slow wave propagation and/or thermal compensation utility) may desirably have a thickness of no greater than 2λ, and/or a thickness that differs from a thickness of each layer of the at least one guided wave confinement structure.

Although lithium niobate and lithium tantalate are particularly preferred piezoelectric materials, in certain embodiments any suitable piezoelectric materials may be used, such as quartz, a piezoceramic, or a deposited piezoelectric material (such as aluminum nitride or zinc oxide).

Guided wave devices as disclosed herein may incorporate various combinations of electrode configurations and guided wave confinement structure configurations as illustrated in the drawings and described herein. In certain embodiments, electrodes are arranged symmetrically relative to a center thickness of a piezoelectric layer (e.g., arranged both above and below the piezoelectric layer, or embedded along a plane equidistant between upper and lower surfaces of the piezoelectric layer) for symmetric guided wave excitation. In other embodiments, electrodes are asymmetrically arranged relative to a center thickness of a piezoelectric layer for asymmetric guided wave excitation. In certain embodiments, MEMS guided wave devices as disclosed herein may employ single-sided confinement, in which at least one confinement structure is provided adjacent to a first surface of a single crystal piezoelectric layer, and in which a solid/air interface is provided adjacent to a second opposing surface of the single crystal piezoelectric layer. Single sided confinement may be employed in combination with symmetric or asymmetric excitation. In other embodiments, MEMS guided wave devices as disclosed herein may employ double- or two-sided confinement, in which first and second confinement structures are provided proximate to first and second opposing surfaces, respectively, of a single crystal piezoelectric layer. In certain embodiments, a first guided wave confinement structure is proximate to a first surface of a piezoelectric layer, and a second guided wave confinement structure is proximate to a second surface of the piezoelectric layer. Two-sided confinement may be employed in combination with symmetric or asymmetric excitation. Electrode configurations that may be employed according to certain embodiments include, but are not limited to, single layer coplanar interdigital transducers (IDTs) alone, multiple layer coplanar IDTs alone, IDTs in combination with electrodes along a second surface of a piezoelectric layer (e.g., continuous layer electrodes useable as floating or shorting electrodes, or segmented or discontinuous electrodes), IDTs at least partially embedded in piezoelectric layers, non-coplanar IDTs, IDTs registered with single crystal piezoelectric layer segments, and periodically poled transducers (PPTs). In certain embodiments, electrodes may be partially embedded in, and/or gaps between various electrodes may be filled in whole or in part with, (i) piezoelectric material, or (ii) slow wave propagation material and/or temperature compensation material.

For each embodiment involving two-sided confinement disclosed herein, alternative embodiments omitting the second (top) side confinement structure are specifically contemplated.

Material that has the potential to become piezoelectric may have a crystalline structure with randomly oriented dipoles. The material becomes piezoelectric by substantially aligning the dipoles to form domains having a substantially uniform dipole orientation, which may be created by poling. Poling may include applying a strong poling electric field to a region of the material to substantially force the dipoles into alignment. When the electric field is removed, much of the alignment remains, thereby providing the piezoelectric properties of the poled material, which is called piezoelectric material. In certain instances, a first set of domains have a nominal domain orientation, and a second set of domains may have an inverted domain (e.g., translated about 180 degrees from the nominal domain). Nominal and inverted domains may be alternately arranged within a periodically poled piezoelectric layer. When such a layer is arranged between first and second electrode layers, the result is a periodically poled transducer.

An interdigital transducer includes electrodes with a first conducting section and a second conducting section that are inter-digitally dispersed in or on a surface or layer. IDTs are well known in the art.

In certain embodiments, at least one functional layer is arranged to at least partially cover at least some electrodes of a plurality of electrodes. In certain embodiments, at least one functional layer covers one group of electrodes, but does not cover another group of electrodes. A functional layer may modify velocity of a transduced acoustic wave and/or alter temperature compensation properties of a MEMS guided wave device. In certain embodiments, at least one functional layer includes a temperature compensation material or a slow wave propagation material.

Although various embodiments disclosed herein include single resonators, it is to be appreciated that any suitable combinations of single or multiple resonators and/or reflector gratings in series and/or in parallel (such as may be embodied in one or more filters) may be provided in a single MEMS guided wave device. In certain embodiments, multiple resonators and/or filters arranged for transduction of acoustic waves of different wavelengths may be provided in a single MEMS guided wave device.

FIG. 1 illustrates a MEMS guided wave device 10 according to one embodiment of the present disclosure. The device 10 includes a single crystal piezoelectric layer 12 (such as lithium niobate or lithium tantalate) on which an IDT 18 and two reflector gratings 20 are provided. The single crystal piezoelectric layer 12 is arranged over a guided wave confinement structure 16, with an optional slow wave propagation layer 14 arranged therebetween. Although not illustrated, an optional carrier substrate may be provided below the guided wave confinement structure 16 in certain embodiments. Both the IDT 18 and the reflector gratings 20 include a number of fingers 24 that are connected to respective bus bars 22. For the reflector gratings 20, all fingers 24 connect to each bus bar 22. For the IDT 18, alternating fingers 24 connect to different bus bars 22, as depicted. Notably, actual reflector gratings 20 and IDTs 18 generally include much larger numbers of fingers 24 than illustrated. The number of fingers 24 has been reduced in FIG. 1 and various accompanying drawings to promote drawing clarity and for ease of explaining the disclosure.

The fingers 24 are parallel to one another and aligned in an acoustic region that encompasses the area in which the reflector gratings 20 and the IDT 18 reside. The wave or waves generated when the IDT 18 is excited with electrical signals essentially reside in this acoustic region. Acoustic waves essentially travel perpendicular to the length of the fingers 24. The guided wave confinement structure 16, which may include a fast wave propagation layer or a Bragg mirror, serves to confine the wave or waves in the single crystal piezoelectric layer 12.

The operating frequency of the MEMS guided wave device 10 is a function of the pitch (P) representing the spacing between fingers 24 of the IDT 18, wherein the wavelength λ equals two times the pitch P. Lateral mode devices also have preferred thickness ranges for the piezoelectric layer 12 for efficient excitation of lateral waves.

To manufacture the MEMS guided wave device 10, a single crystal piezoelectric wafer may be prefabricated, and separately the slow wave propagation layer 14 may be deposited on the guided wave confinement structure 16 (which may optionally be supported by a carrier substrate). Adjacent surfaces of the piezoelectric wafer and the slow wave propagation layer 14 are planarized and polished, and then attached to one another via a conventional direct bonding (e.g., wafer bonding) process or other process. One or more bonding promoting layers may optionally be arranged between the respective layers to be bonded. Following bonding, the exposed upper surface of the piezoelectric layer 12 is ground (optionally also planarized) to a desired thickness, and the reflector gratings 20 and the IDT 18 are deposited thereon.

In certain embodiments, the slow wave propagation layer 14 may provide thermal compensation utility. The materials used to form the single crystal piezoelectric wafer typically have different thermal coefficients of expansion (TCE) relative to the TCE of materials of the guided wave confinement structure 16. Once the guided wave confinement structure 16 is created, the piezoelectric layer 12 and the slow wave propagation layer 14 tend to expand and contract in a similar manner as temperature changes. As such, the expansion and contraction forces applied to the guided wave confinement structure 16 by the piezoelectric layer 12 due to temperature changes are substantially countered by opposing forces applied by the intermediately arranged slow wave propagation layer 14. As a result, the composite structure including the intermediately arranged slow wave propagation layer 14 resists bending or warping as temperature changes, thereby reducing expansion and contraction of the piezoelectric layer 12, and reducing the effective TCE of the piezoelectric layer 12.

Since providing the slow wave propagation layer 14 between the piezoelectric layer 12 and the guided wave confinement structure 16 reduces the effective TCE of the piezoelectric material, the amount of expansion and contraction along the surface of the piezoelectric layer 12 as temperature changes is reduced. Therefore, the change in spacing, or pitch, between fingers 24 of the IDT 18 and the reflector gratings 20 as temperature changes is reduced, thereby reducing the effective thermal coefficient of frequency (TCF) of the piezoelectric layer 12 to improve overall frequency response of the IDT 18 and the reflector gratings 20 with changes in temperature.

A MEMS guided wave structure 10 as illustrated in FIG. 1 may be solidly mounted to a carrier substrate, or alternatively at least a portion of such a structure may be suspended above a carrier substrate with a gap arranged therebetween.

Figure 2:
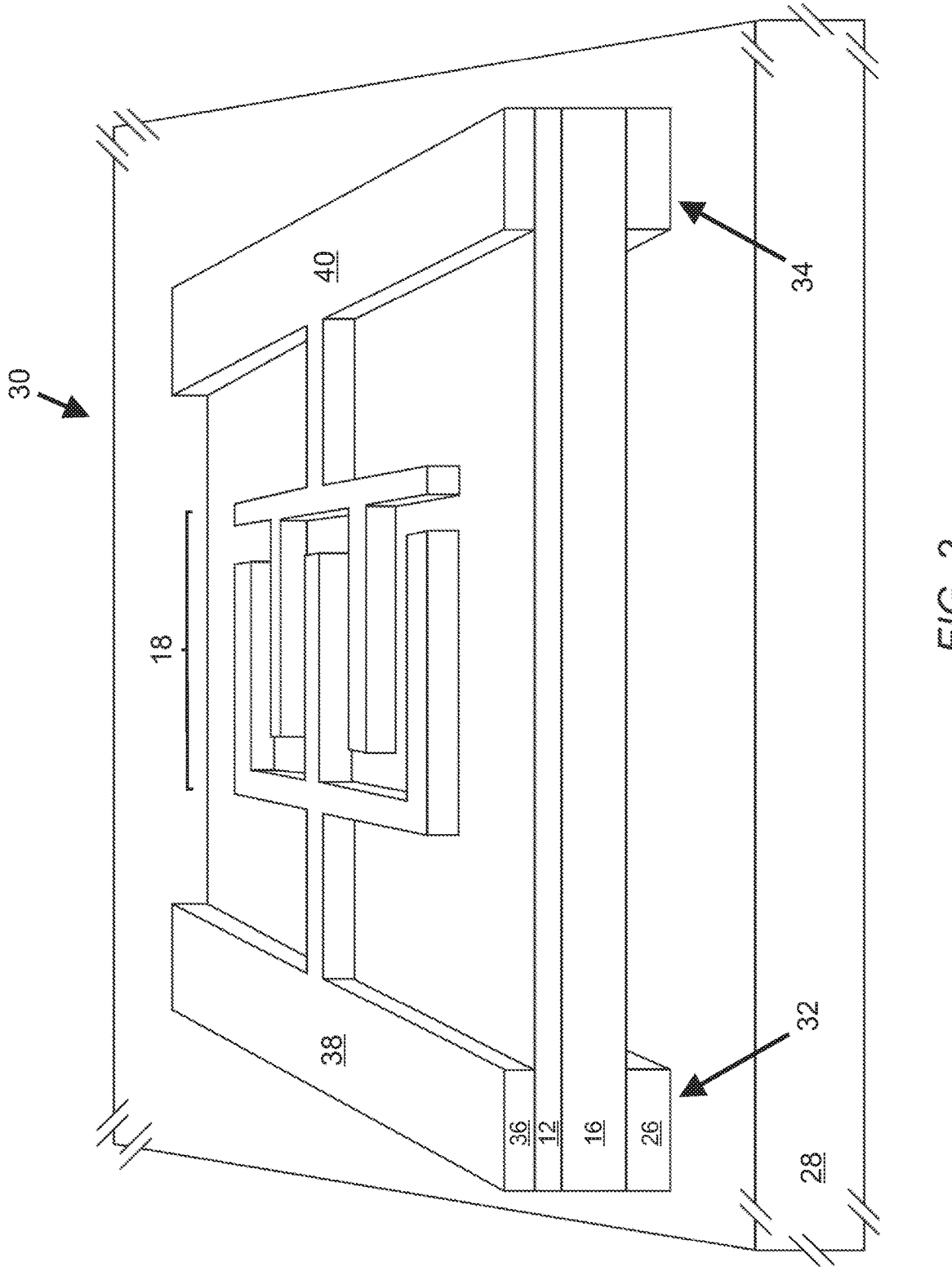
FIG. 2 is a perspective view of a MEMS guided wave device including an IDT arranged over portions of a piezoelectric layer and a guided wave confinement structure suspended between anchors according to one embodiment of the present disclosure.

FIG. 2 illustrates a MEMS guided wave device 30 including an IDT 18 arranged over portions of a single crystal piezoelectric layer 12 and a guided wave confinement structure 16 in combination that are elevated above a substrate 28 and suspended between anchors 32, 34 according to one embodiment of the present disclosure. A conductive layer 36 is arranged on the piezoelectric layer 12 to form the IDT 18 including electrodes, providing a first conductive section 38 and a second conductive section 40. The single crystal piezoelectric layer 12 is arranged over the guided wave confinement structure 16, supported along peripheral portions thereof from below by an insulating layer 26 located over the substrate 28. A central portion of the insulating layer 26 may be removed by etching (e.g., using vias or other openings (not shown) defined through the substrate 28 or the piezoelectric layer 12 and guided wave confinement structure 16), leaving anchors 32, 34 laterally bounding a central cavity. The central portions of the guided wave confinement structure 16 and the overlying piezoelectric layer 12 (both in substantially continuous form), together with the IDT 18, are suspended between the anchors 32, 34. Although not shown, in certain embodiments the MEMS guided wave device 30 may further include a slow wave propagation layer between the single crystal piezoelectric layer 12 and the guided wave confinement structure 16, which may provide temperature compensation utility.

Figure 3:
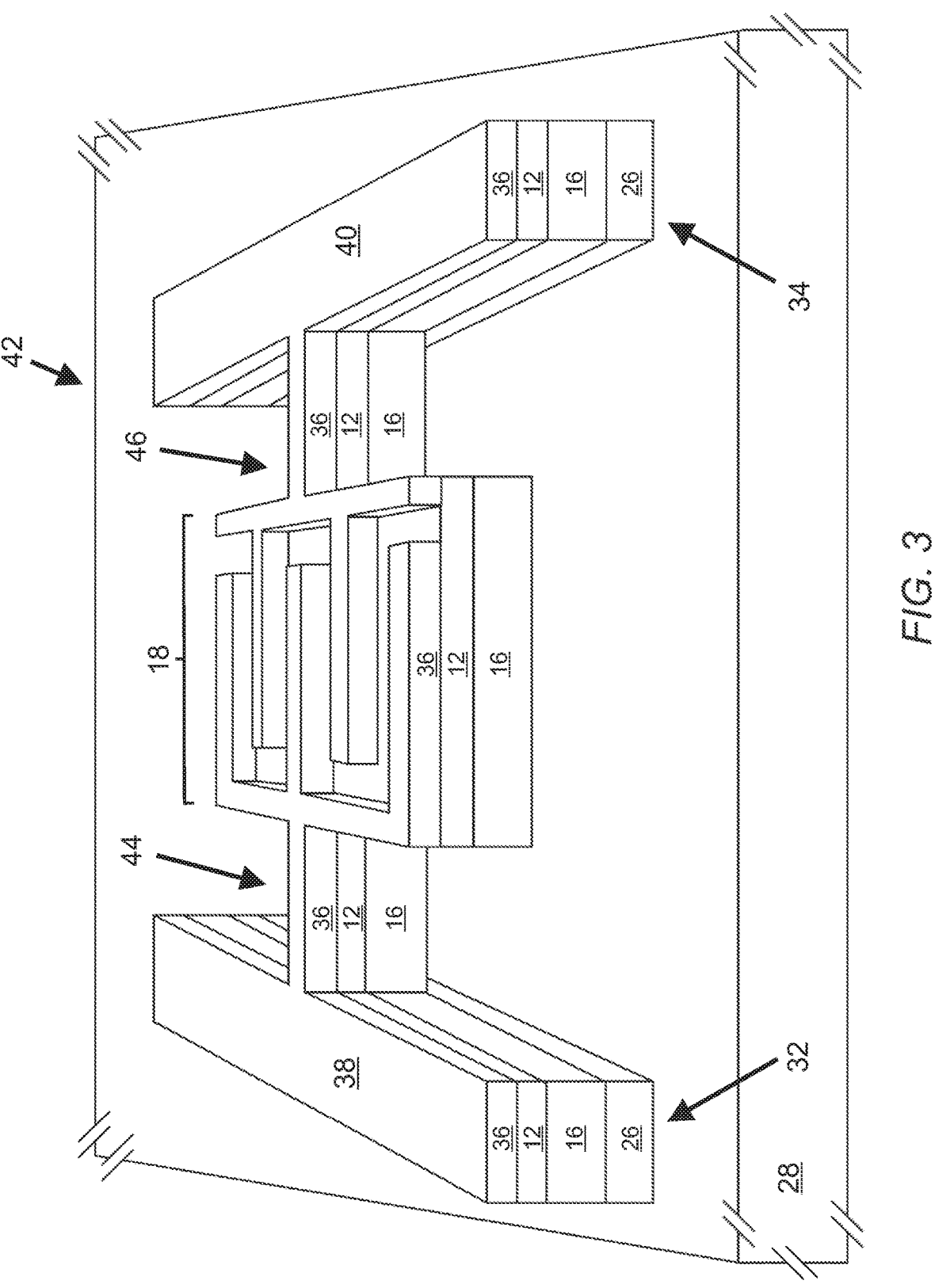
FIG. 3 is a perspective view of a MEMS guided wave device including an IDT arranged over portions of a piezoelectric layer and a guided wave confinement structure suspended by narrow mechanical supports between anchors according to one embodiment of the present disclosure.

FIG. 3 illustrates a MEMS guided wave device 42 including an IDT 18 arranged over portions of a single crystal piezoelectric layer 12 and a guided wave confinement structure 16 in combination that are elevated above a substrate 28 and suspended by narrowed mechanical supports 44, 46 between anchors 32, 34 according to one embodiment of the present disclosure. A conductive layer 36 is arranged on the piezoelectric layer 12 to form the IDT 18, including electrodes providing a first conductive section 38 and a second conductive section 40. The single crystal piezoelectric layer 12 is arranged over the guided wave confinement structure 16, supported along peripheral portions thereof from below by an insulating layer 26 located over the substrate 28. Portions of the insulating layer 26 may be removed by etching, leaving anchors 32, 34 laterally bounding a central cavity. Additionally, portions of the single crystal piezoelectric layer 12 and the guided wave confinement structure 16 are removed to leave only the narrowed mechanical supports 44, 46 to support central portions of the piezoelectric layer 12 and the guided wave confinement structure 16 (as well as the IDT 18) between the anchors 32, 34. Although not shown, in certain embodiments the MEMS guided wave device 42 may further include a slow wave propagation layer between the single crystal piezoelectric layer 12 and the guided wave confinement structure 16, which may provide temperature compensation utility.

Additional MEMS guided wave devices including further electrode configurations and guided wave confinement structure configurations are illustrated in the following figures. Although the following figures illustrate single crystal piezoelectric layers and guided wave confinement structures appearing to be solidly mounted to carrier substrates, it is to be appreciated that in each instance the illustrated single crystal piezoelectric layers and guided wave confinement structures (together with accompanying electrodes) may be devoid of a substrate or suspended above a carrier substrate (such as shown in FIGS. 2-3).

Figure 4:
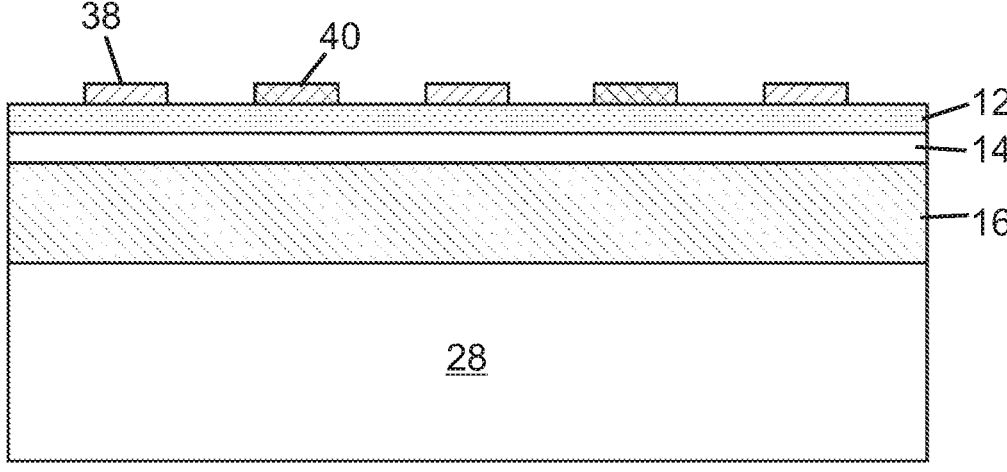
FIG. 4 is a side cross-sectional view of a MEMS guided wave device including top side electrodes in the form of an IDT arranged over a piezoelectric layer, a slow wave propagation layer, a fast wave propagation layer serving as a one-sided guided wave confinement structure, and a carrier substrate according to one embodiment of the present disclosure.

FIG. 4 illustrates a MEMS guided wave device including alternating top side electrodes 38, 40 in the form of an IDT arranged over a single crystal piezoelectric layer 12, an optional slow wave propagation layer 14, a fast wave propagation layer serving as a one-sided guided wave confinement structure 16, and an optional carrier substrate 28 according to one embodiment of the present disclosure. The electrodes 38, 40 are disposed solely on a top surface of the piezoelectric layer 12 and are therefore asymmetrically arranged relative to a center of the piezoelectric layer 12. The guided wave confinement structure 16 and optional slow wave propagation layer 14 may be deposited over the substrate 28. The MEMS guided wave device may be formed by bonding a prefabricated single crystal piezoelectric wafer over the guided wave confinement structure 16 (e.g., with the slow wave propagation layer 14 therebetween), processing an exposed surface of the piezoelectric wafer to a desired thickness to yield the piezoelectric layer 12, and depositing the electrodes 38, 40 thereon.

Figure 5:
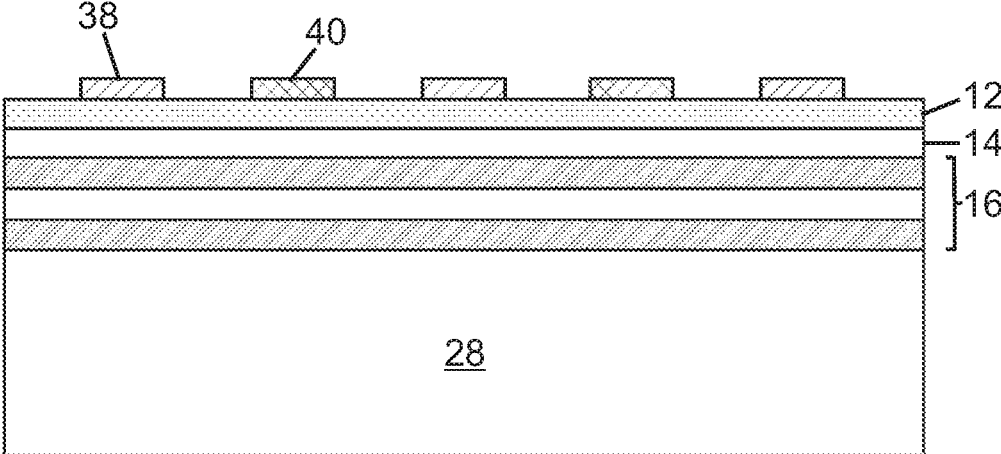
FIG. 5 is a side cross-sectional view of a MEMS guided wave device including top side electrodes in the form of an IDT arranged over a piezoelectric layer, a slow wave propagation layer, a Bragg mirror serving as a one-sided guided wave confinement structure, and a carrier substrate according to one embodiment of the present disclosure.

FIG. 5 illustrates a MEMS guided wave device including alternating top side electrodes 38, 40 in the form of an IDT arranged over a single crystal piezoelectric layer 12, an optional slow wave propagation layer 14, a Bragg mirror serving as a one-sided guided wave confinement structure 16, and an optional carrier substrate 28 according to one embodiment of the present disclosure. The device of FIG. 5 may be fabricated in a manner similar to the device of FIG. 4.

Figure 6:
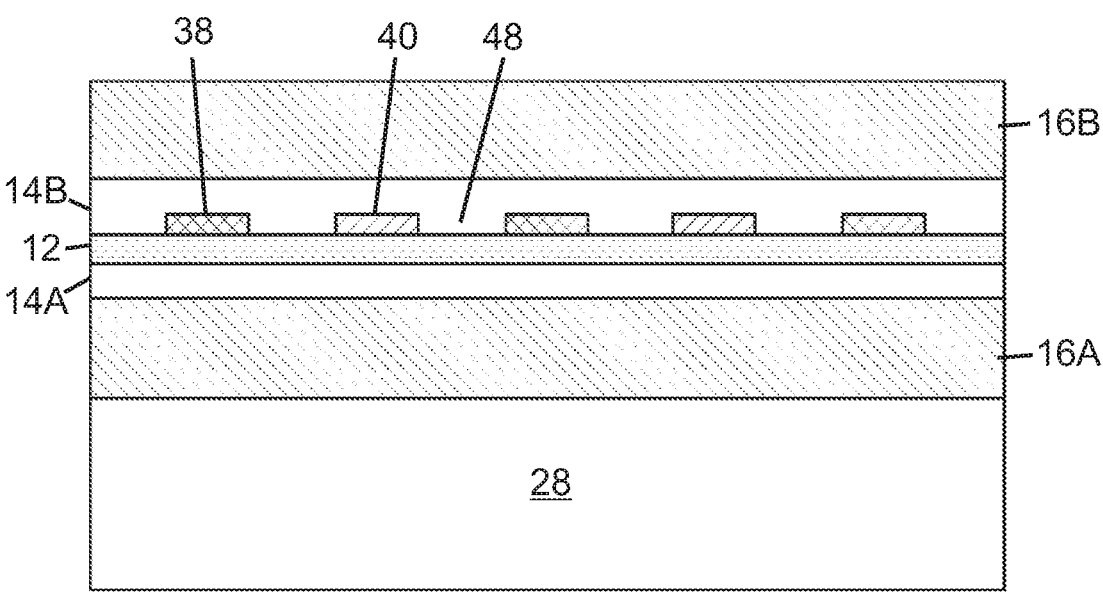
FIG. 6 is a side cross-sectional view of a MEMS guided wave device including electrodes in the form of an IDT arranged on only one face of a piezoelectric layer, with slow wave propagation layers sandwiching the electrodes and the piezoelectric layer, and two-sided guided wave confinement provided by first and second fast wave propagation layers according to one embodiment of the present disclosure.

FIG. 6 illustrates a MEMS guided wave device including alternating electrodes 38, 40 in the form of an IDT arranged over one surface of a single crystal piezoelectric layer 12 according to one embodiment of the present disclosure. Optional slow wave propagation layers 14A, 14B sandwich the electrodes 38, 40 and the piezoelectric layer 12. A portion of the upper slow wave propagation layer 14B is arranged to at least partially (and preferably completely) fill gaps 48 between the electrodes 38, 40. Two-sided guided wave confinement is provided by first and second fast wave propagation layers serving as first and second guided wave confinement structures 16A, 16B that sandwich the slow wave propagation layers 14A, 14B. An optional substrate 28 is disposed under the first guided wave confinement structure 16A. The electrodes 38, 40 are disposed solely on one surface of the piezoelectric layer 12 and are therefore asymmetrically arranged relative to a center of the piezoelectric layer 12. A lower portion of the device of FIG. 6 may be fabricated in a manner similar to the MEMS guided wave device of FIG. 4. After formation of the electrodes 38, 40, the optional second slow wave propagation layer 14B is deposited over the piezoelectric layer 12 and the electrodes 38, 40, and the second guided wave confinement structure 16B is deposited over the second slow wave propagation layer 14B.

Figure 7:
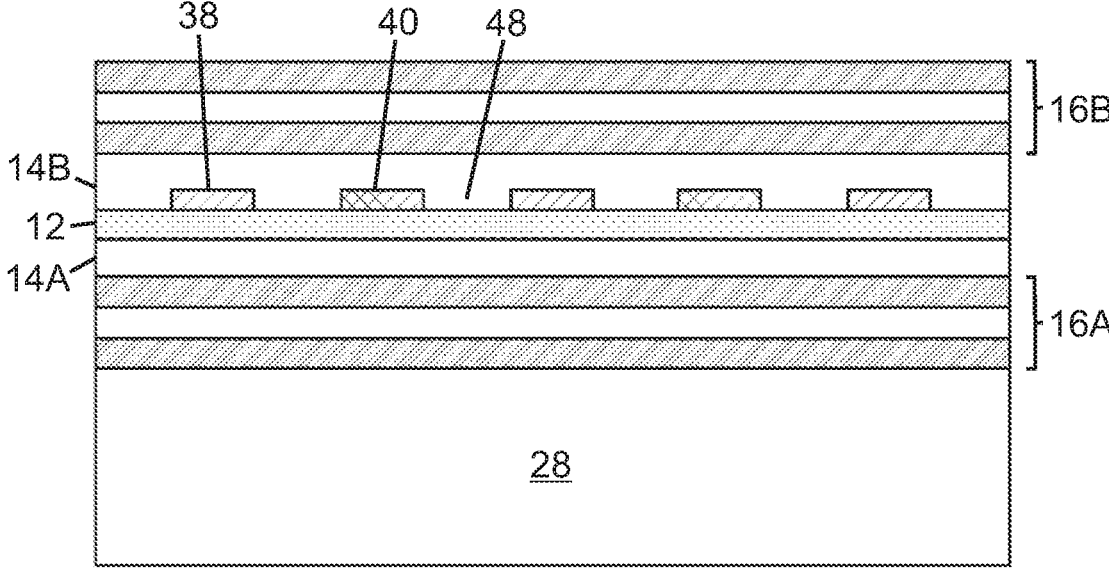
FIG. 7 is a side cross-sectional view of a MEMS guided wave device including electrodes in the form of an IDT arranged on one face of a piezoelectric layer, with slow wave propagation layers sandwiching the electrodes and the piezoelectric layer, and two-sided guided wave confinement provided by first and second Bragg mirrors according to one embodiment of the present disclosure.

FIG. 7 illustrates a MEMS guided wave device substantially similar to the device of FIG. 6, except that first and second Bragg mirrors are used instead of first and second fast wave propagation layers 16A, 16B. Fabrication of the device of FIG. 7 is substantially similar to fabrication of the device of FIG. 6. Although FIGS. 6 and 7 depict MEMS guided wave devices with two-sided confinement, in alternative embodiments the second (top) side confinement structure may be omitted.

Figure 8:
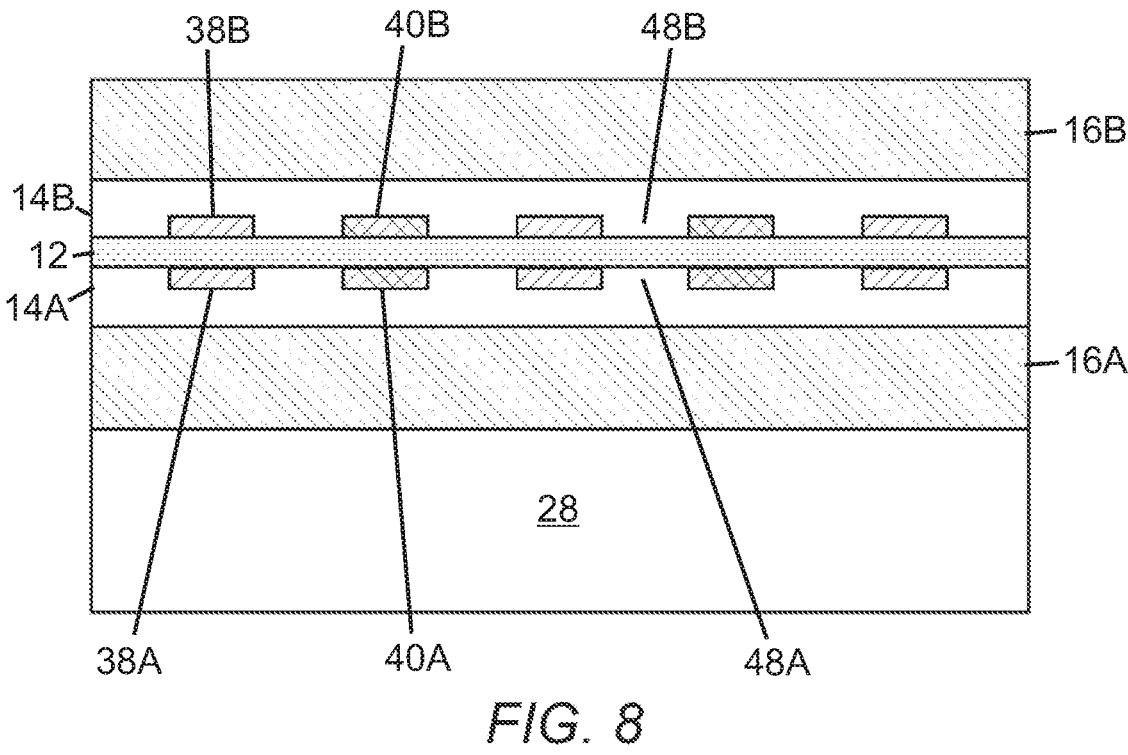
FIG. 8 is a side cross-sectional view of a MEMS guided wave device including electrodes in the form of first and second IDTs arranged on first and second faces of a piezoelectric layer, respectively, with slow wave propagation layers sandwiching the electrodes and the piezoelectric layer, and two-sided guided wave confinement provided by first and second fast wave propagation layers according to one embodiment of the present disclosure.

FIG. 8 illustrates a MEMS guided wave device including alternating electrodes 38A, 40A in the form of a first IDT arranged on the lower surface of a single crystal piezoelectric layer 12 and alternating top side electrodes 38B, 40B in the form of a second IDT arranged on the upper surface of the piezoelectric layer 12, according to one embodiment of the present disclosure. Optional slow wave propagation layers 14A, 14B sandwich the electrodes 38A, 40A, 38B, 40B and the piezoelectric layer 12, with portions of the slow wave propagation layers 14A, 14B being arranged to at least partially (and preferably completely) fill gaps 48A, 48B between the electrodes 38A, 40A, 38B, 40B. The electrodes 38A, 40A, 38B, 40B are symmetrically arranged relative to a center of the piezoelectric layer 12. Two-sided guided wave confinement is provided by first and second fast wave propagation layers serving as first and second guided wave confinement structures 16A, 16B that sandwich the slow wave propagation layers 14A, 14B. An optional substrate 28 is disposed under the first guided wave confinement structure 16A. To fabricate the MEMS guided wave device of FIG. 8, a lower subassembly including the substrate 28, the first guided wave confinement structure 16A, and the first slow wave propagation layer 14A is produced. Recesses may be defined (e.g., via etching) in an upper surface of the first slow wave propagation layer 14A, and metal may be deposited in the recesses to form the lower electrodes 38A, 40A. Following planarization and polishing of the first slow wave propagation layer 14A and lower electrodes 38A, 40A, a prefabricated single crystal piezoelectric wafer may be directly bonded to the lower subassembly and processed (e.g., via grinding and polishing) to a desired thickness to form the piezoelectric layer 12. Thereafter, the upper electrodes 38B, 40B may be deposited on the piezoelectric layer 12, followed by deposition of the second slow wave propagation layer 14B and the second guided wave confinement structure 16B.

Figure 9:
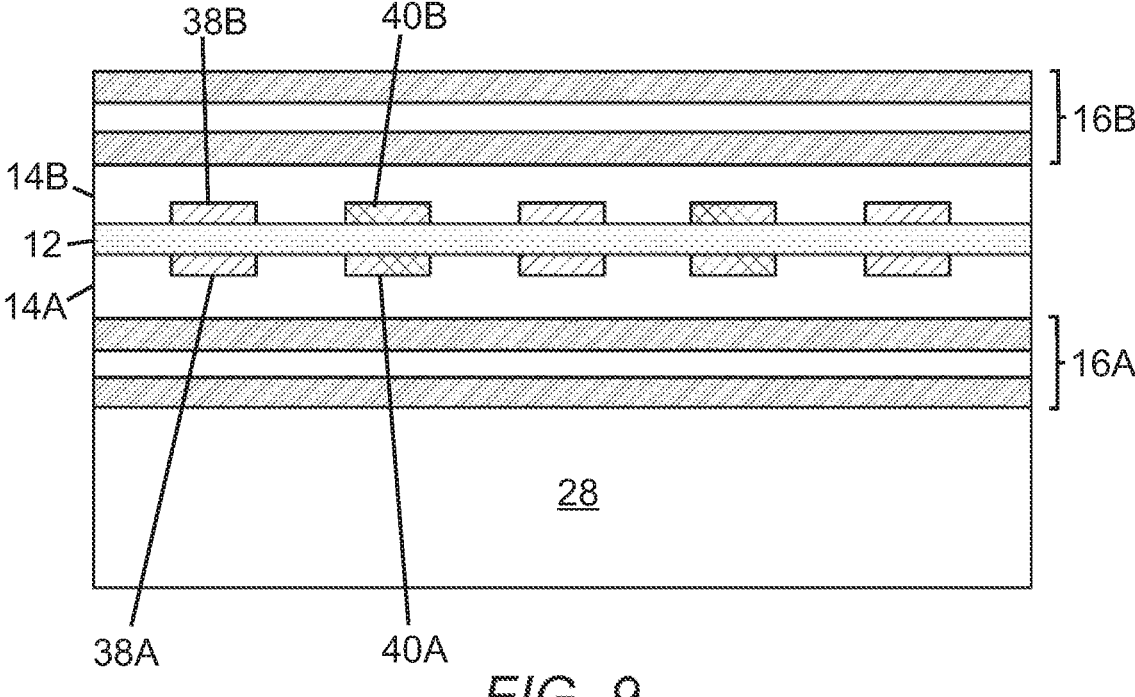
FIG. 9 is a side cross-sectional view of a MEMS guided wave device including electrodes in the form of first and second IDTs arranged on first and second faces of a piezoelectric layer, respectively, with slow wave propagation layers sandwiching the electrodes and the piezoelectric layer, and two-sided guided wave confinement provided by first and second Bragg mirrors according to one embodiment of the present disclosure.

FIG. 9 illustrates a MEMS guided wave device substantially similar to the device of FIG. 8, except that first and second Bragg mirrors are used instead of first and second fast wave propagation layers as the first and second guided wave confinement structures 16A, 16B. Fabrication of the device of FIG. 9 is substantially similar to fabrication of the device of FIG. 8. Although FIGS. 8 and 9 depict MEMS guided wave devices with two-sided confinement, in alternative embodiments the second (top) side confinement structure 16B may be omitted, optionally in combination with omission of the second slow wave propagation layer 14B.

Although FIGS. 8 and 9 illustrate two IDTs in phase (wherein electrodes of corresponding types (e.g., 38A, 38B or 40A, 40B) are aligned with one another on opposite faces of the piezoelectric layer 12, such that positive overlies positive and negative overlies negative), in alternate embodiments, IDTs may be arranged out of phase, with electrodes of opposing types (e.g., 38A, 40B or 40A, 38B) being aligned with one another on opposite faces of the piezoelectric layer 12, such that positive overlies negative, and vice-versa. This modification may be applied to any embodiments disclosed herein in which multiple IDTs are arranged on or adjacent to opposing faces of a piezoelectric layer.

Figure 10:
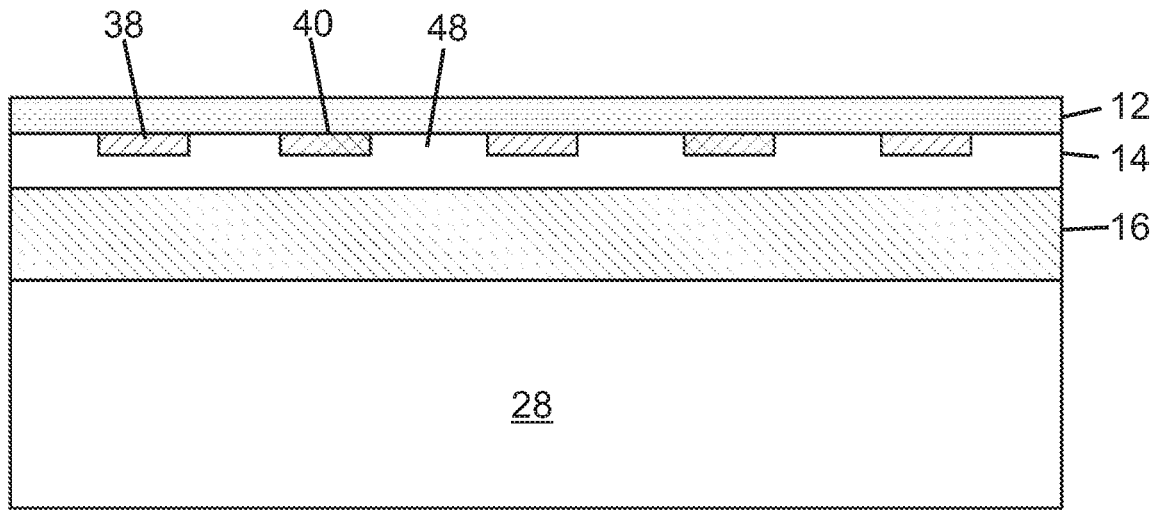
FIG. 10 is a side cross-sectional view of a MEMS guided wave device including electrodes in the form of an IDT arranged on only one face of a piezoelectric layer within a slow wave propagation layer, and with one-sided guided wave confinement provided by a fast wave propagation layer according to one embodiment of the present disclosure.

FIG. 10 illustrates a MEMS guided wave device including alternating electrodes 38, 40 in the form of an IDT arranged on the lower surface of a single crystal piezoelectric layer 12 according to one embodiment of the present disclosure. An optional slow wave propagation layer 14, a fast wave propagation layer serving as a one-sided guided wave confinement structure 16, and an optional carrier substrate 28 are arranged under the electrodes 38, 40 and the piezoelectric layer 12. The electrodes 38, 40 are disposed solely on a bottom surface of the piezoelectric layer 12 and are therefore asymmetrically arranged relative to a center of the piezoelectric layer 12. The guided wave confinement structure 16 and optional slow wave propagation layer 14 may be deposited over the substrate 28. A portion of the slow wave propagation layer 14 is arranged to at least partially (and preferably completely) fill gaps 48 between the electrodes 38, 40. To fabricate the MEMS guided wave device of FIG. 10, a lower subassembly including the substrate 28, the guided wave confinement structure 16, and the slow wave propagation layer 14 is produced. Recesses may be defined (e.g., via etching) in an upper surface of the slow wave propagation layer 14, and metal may be deposited in the recesses to form the electrodes 38, 40. Following planarization and polishing of the slow wave propagation layer 14 and the electrodes 38, 40, a prefabricated single crystal piezoelectric wafer may be directly bonded to the lower subassembly and processed (e.g., via grinding and polishing) to a desired thickness to form the piezoelectric layer 12. Alternatively, the electrodes 38, 40 may be patterned on the single crystal piezoelectric wafer, the slow wave propagation layer 14 may be deposited over the electrodes, and after planarizing the slow wave propagation layer 14 is may be bonded to the substrate 28.

Figure 11:
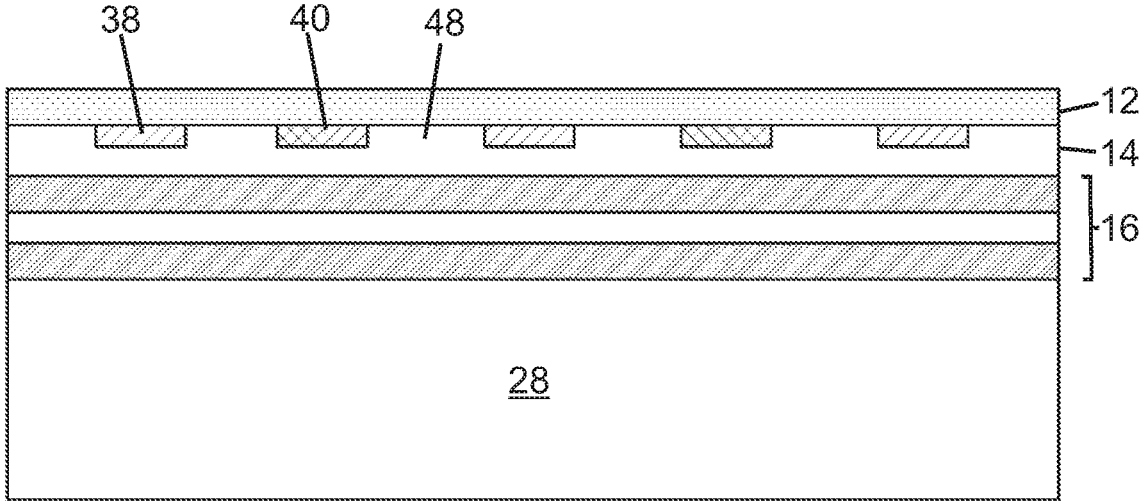
FIG. 11 is a side cross-sectional view of a MEMS guided wave device including electrodes in the form of an IDT arranged on only one face of a piezoelectric layer within a slow wave propagation layer, and with one-sided guided wave confinement provided by a Bragg mirror according to one embodiment of the present disclosure.

FIG. 11 illustrates a MEMS guided wave device substantially similar to the device of FIG. 10, except that a Bragg mirror is used instead of a fast wave propagation layer as a guided wave confinement structure 16. Fabrication of the device of FIG. 11 is substantially similar to fabrication of the device of FIG. 10.

Figure 12:
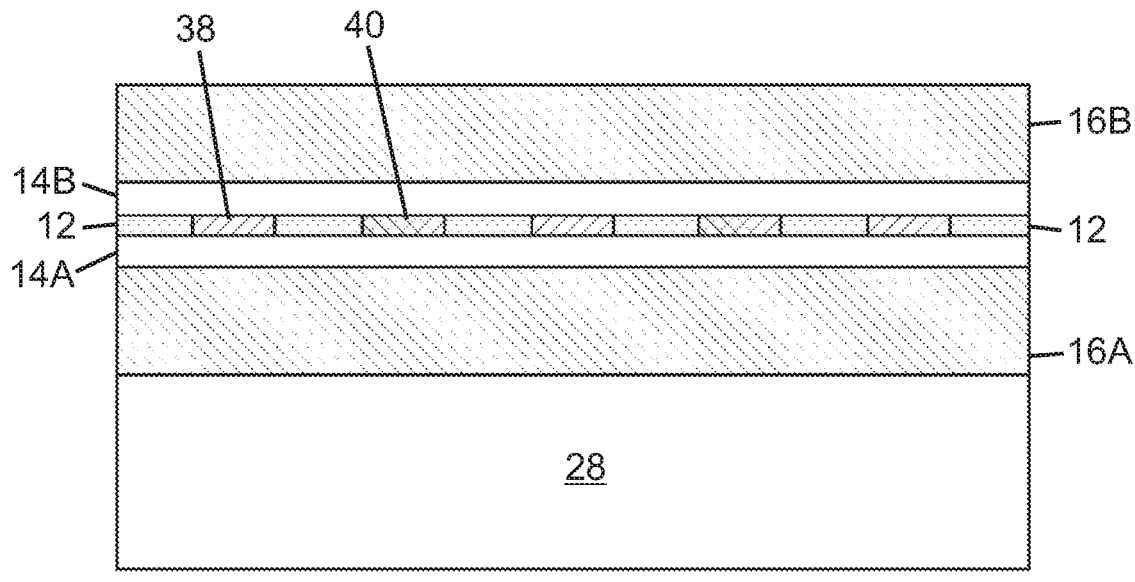
FIG. 12 is a side cross-sectional view of a MEMS guided wave device including electrodes in the form of an IDT embedded in and extending through the entire thickness of a piezoelectric layer, with slow wave propagation layers sandwiching the electrodes and the piezoelectric layer, and two-sided guided wave confinement provided by first and second fast wave propagation layers according to one embodiment of the present disclosure.

FIG. 12 illustrates a MEMS guided wave device including electrodes 38, 40 in the form of an IDT embedded in and extending through the entire thickness of a piezoelectric layer 12, with slow wave propagation layers 14A, 14B sandwiching the electrodes 38, 40 and the piezoelectric layer 12. Two sided guided wave confinement is provided by first and second fast wave propagation layers serving as first and second guided wave confinement structures 16A, 16B that sandwich the slow wave propagation layers 14A, 14B. An optional substrate 28 is disposed under the first guided wave confinement structure 16A. The electrodes 38, 40 are symmetrically arranged relative to a center thickness of the piezoelectric layer 12. To fabricate the MEMS guided wave device of FIG. 12, a lower subassembly including the substrate 28, the first guided wave confinement structure 16A, and the first slow wave propagation layer 14A is produced. Following planarization and polishing of the first slow wave propagation layer 14A, a prefabricated single crystal piezoelectric wafer may be directly bonded to the lower subassembly. Thereafter, apertures or recesses may be defined in the piezoelectric wafer by any suitable technique, such as ion milling, and metal may be deposited (e.g., via evaporative deposition) in the apertures or recesses to form electrodes 38, 40. The piezoelectric wafer and deposited electrodes may then be processed (e.g., via grinding and polishing) to a desired thickness that exposes the electrodes 38, 40 to form a piezoelectric layer 12 with electrodes 38, 40 extending through the entire thickness thereof. Thereafter, the second slow wave propagation layer 14B and the second guided wave confinement structure 16B may be sequentially deposited over the piezoelectric layer 12.

Figure 13:
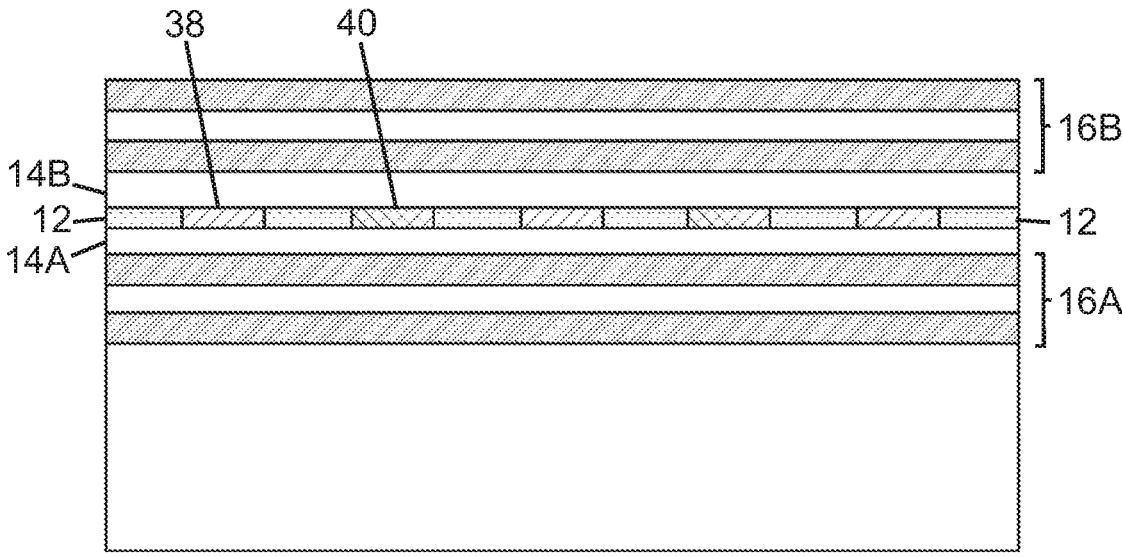
FIG. 13 is a side cross-sectional view of a MEMS guided wave device including electrodes in the form of an IDT embedded in and extending through the entire thickness of a piezoelectric layer, with slow wave propagation layers sandwiching the electrodes and the piezoelectric layer, and two-sided guided wave confinement provided by first and second Bragg mirrors according to one embodiment of the present disclosure.

FIG. 13 illustrates a MEMS guided wave device substantially similar to the device of FIG. 12, except that first and second Bragg mirrors are used instead of first and second fast wave propagation layers as the first and second guided wave confinement structures 16A, 16B. Fabrication of the device of FIG. 13 is substantially similar to fabrication of the device of FIG. 12. Although FIGS. 12 and 13 depict MEMS guided wave devices with two-sided confinement, in alternative embodiments the second (top) side confinement structure 16B may be omitted, optionally in combination with omission of the second slow wave propagation layer 14B.

Figure 14:
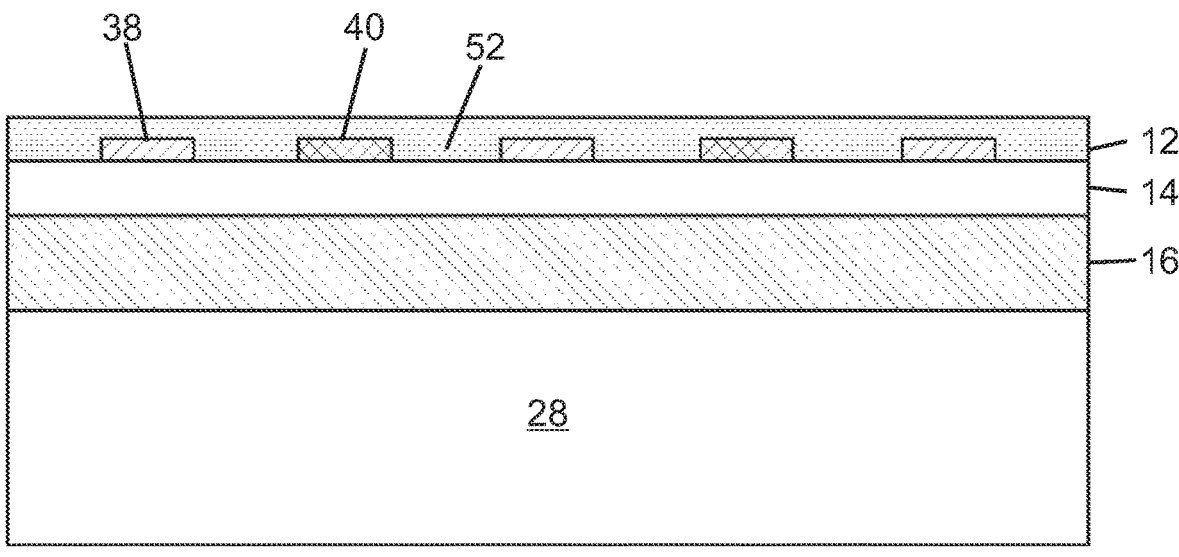
FIG. 14 is a side cross-sectional view of a MEMS guided wave device including electrodes in the form of an IDT embedded in a single face of a piezoelectric layer, with a slow wave propagation layer contacting the electrodes and the piezoelectric layer, and one-sided guided wave confinement provided by a fast wave propagation layer according to one embodiment of the present disclosure.

FIG. 14 illustrates a MEMS guided wave device including electrodes 38, 40 in the form of an IDT embedded in a lower face of a single crystal piezoelectric layer 12, with an optional slow wave propagation layer 14 contacting the electrodes 38, 40 and the piezoelectric layer 12, and one sided guided wave confinement provided by a fast wave propagation layer serving as a guided wave confinement structure 16 according to one embodiment of the present disclosure. The electrodes 38, 40 are asymmetrically arranged relative to a center of the piezoelectric layer 12, and gaps 52 between the electrodes 38, 40 are filled with piezoelectric material. To fabricate the MEMS guided wave device of FIG. 14, the guided wave confinement structure 16 and optional slow wave propagation layer 14 may be deposited over a substrate 28 to form a lower subassembly. Separately, recesses may be defined in a surface of a single crystal piezoelectric wafer by any suitable technique, such as photolithographic etching, and metal may be deposited in the recesses to form electrodes 38, 40. The piezoelectric wafer surface containing the deposited electrode material may be planarized and polished and directly bonded to a planarized and polished surface of the slow wave propagation layer 14. Thereafter, the exposed upper surface of the piezoelectric wafer may be processed (e.g., via grinding) to a desired thickness to yield the piezoelectric layer 12 with electrodes 38, 40 recessed in a lower portion thereof.

Figure 15:
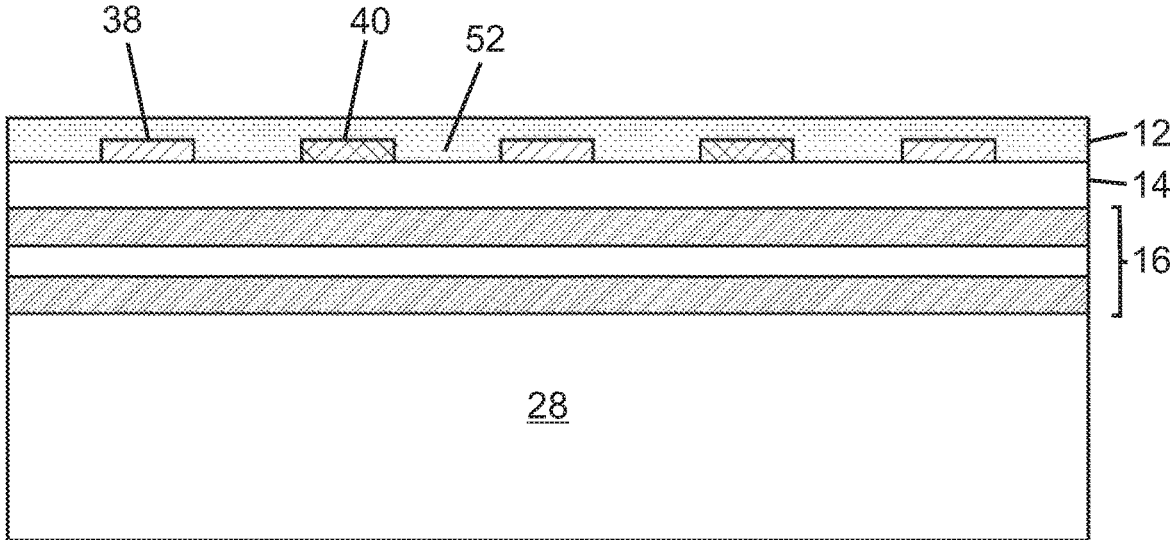
FIG. 15 is a side cross-sectional view of a MEMS guided wave device including electrodes in the form of an IDT embedded in a single face of a piezoelectric layer, with a slow wave propagation layer contacting the electrodes and the piezoelectric layer, and one-sided guided wave confinement provided by a Bragg mirror according to one embodiment of the present disclosure.

FIG. 15 illustrates a MEMS guided wave device substantially similar to the device of FIG. 14, except that a Bragg mirror is used instead of a fast wave propagation layer as a guided wave confinement structure 16. Fabrication of the device of FIG. 15 is substantially similar to fabrication of the device of FIG. 14.

Figure 16:
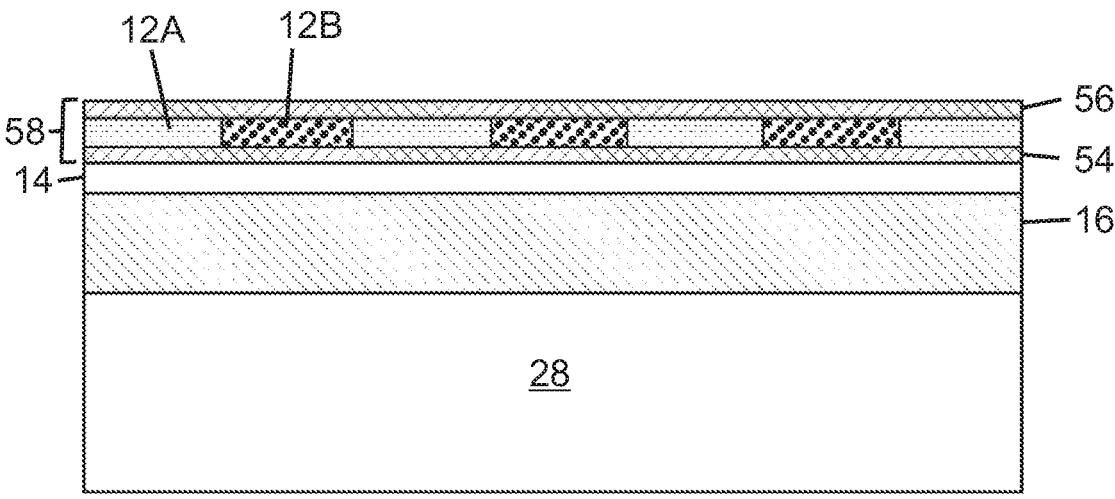
FIG. 16 is a side cross-sectional view of a MEMS guided wave device including a periodically poled transducer (PPT) having electrode layers sandwiching a piezoelectric layer with alternating polarity regions, and further including a slow wave propagation layer, a fast wave propagation layer serving as a one-sided guided wave confinement structure, and a carrier substrate according to one embodiment of the present disclosure.

FIG. 16 illustrates a MEMS guided wave device including a PPT 58 having electrode layers 54, 56 sandwiching a piezoelectric layer with alternating polarity piezoelectric regions 12A, 12B, and further including an optional slow wave propagation layer 14, a fast wave propagation layer serving as a one-sided guided wave confinement structure 16, and an optional carrier substrate 28 according to one embodiment of the present disclosure. The electrode layers 54, 56 are symmetrically arranged relative to a center of the piezoelectric layer consisting of the alternating polarity piezoelectric regions 12A, 12B. To fabricate the MEMS guided wave device of FIG. 16, the guided wave confinement structure 16, the optional slow wave propagation layer 14, and the first electrode layer 54 may be deposited over the substrate 28 to form a lower subassembly. A piezoelectric wafer may be directly bonded to the lower subassembly, preceded and optionally followed with appropriate planarization and/or polishing steps. In certain embodiments, alternating polarity piezoelectric regions 12A, 12B may be defined (e.g., via liquid cell poling or e-beam writing) prior to bonding; in other embodiments, the alternating polarity piezoelectric regions 12A, 12B may be defined after bonding is complete. Thereafter, the second electrode layer 56 may be deposited over the alternating polarity piezoelectric regions 12A, 12B to form the PPT 58. Examples of PPT structures and PPT fabrication techniques are disclosed in U.S. Pat. No. 7,898,158, which is hereby incorporated by reference herein.

Figure 17:
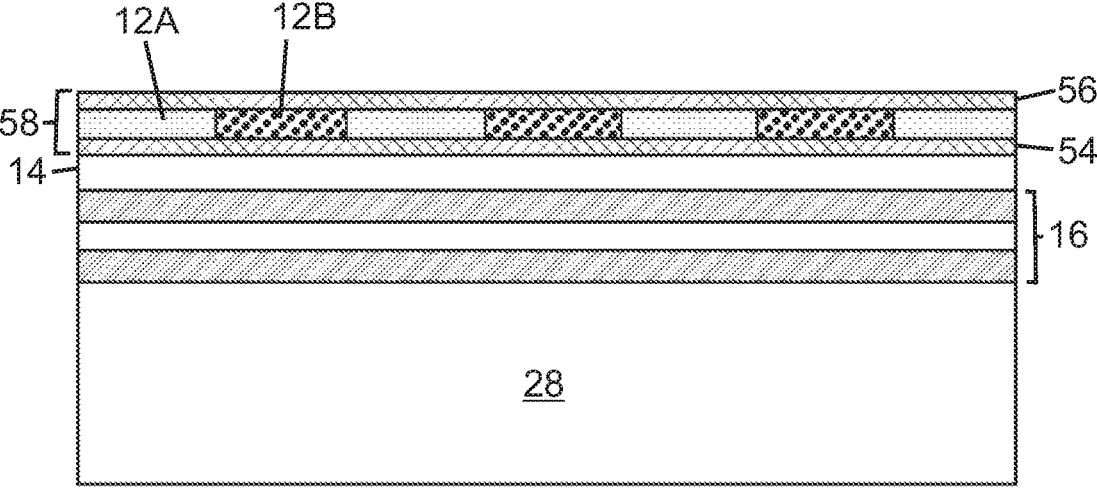
FIG. 17 is a side cross-sectional view of a MEMS guided wave device including a PPT having electrode layers sandwiching a piezoelectric layer with alternating polarity regions, and further including a slow wave propagation layer, a Bragg mirror serving as a one-sided guided wave confinement structure, and a carrier substrate according to one embodiment of the present disclosure.

FIG. 17 illustrates a MEMS guided wave device substantially similar to the device of FIG. 16, except that a Bragg mirror is used instead of a fast wave propagation layer as a guided wave confinement structure 16. Fabrication of the device of FIG. 17 is substantially similar to fabrication of the device of FIG. 16.

Figure 18:
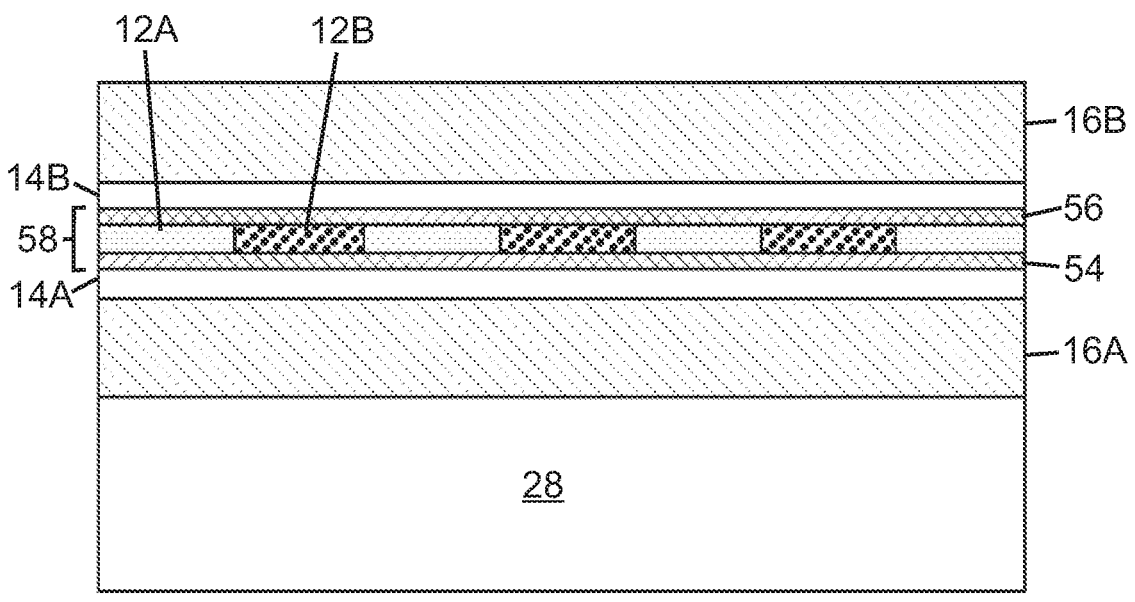
FIG. 18 is a side cross-sectional view of a MEMS guided wave device including a PPT having electrode layers sandwiching a piezoelectric layer with alternating polarity regions, and further including slow wave propagation layers sandwiching the PPT, first and second fast wave propagation layers serving as a two-sided guided wave confinement structure, and a carrier substrate according to one embodiment of the present disclosure.

FIG. 18 illustrates a MEMS guided wave device with a PPT similar to the device of FIG. 16, but with addition of double sided confinement. The device of FIG. 18 includes a PPT 58 having electrode layers 54, 56 sandwiching a piezoelectric layer with alternating polarity piezoelectric regions 12A, 12B, and further including optional slow wave propagation layers 14A, 14B sandwiching the PPT 58. Additionally, first and second fast wave propagation layers serving as first and second guided wave confinement structures 16A, 16B provide two-sided confinement. An optional substrate 28 is disposed under the first guided wave confinement structure 16A. The electrode layers 54, 56 are symmetrically arranged relative to a center thickness of the piezoelectric layer. Fabrication of a lower portion of the MEMS guided wave device of FIG. 18 proceeds according to the steps employed in fabricating the device of FIG. 16, with the additional steps of depositing the second slow wave propagation layer 14B and the second guided wave confinement structure 16B over the PPT 58.

Figure 19:
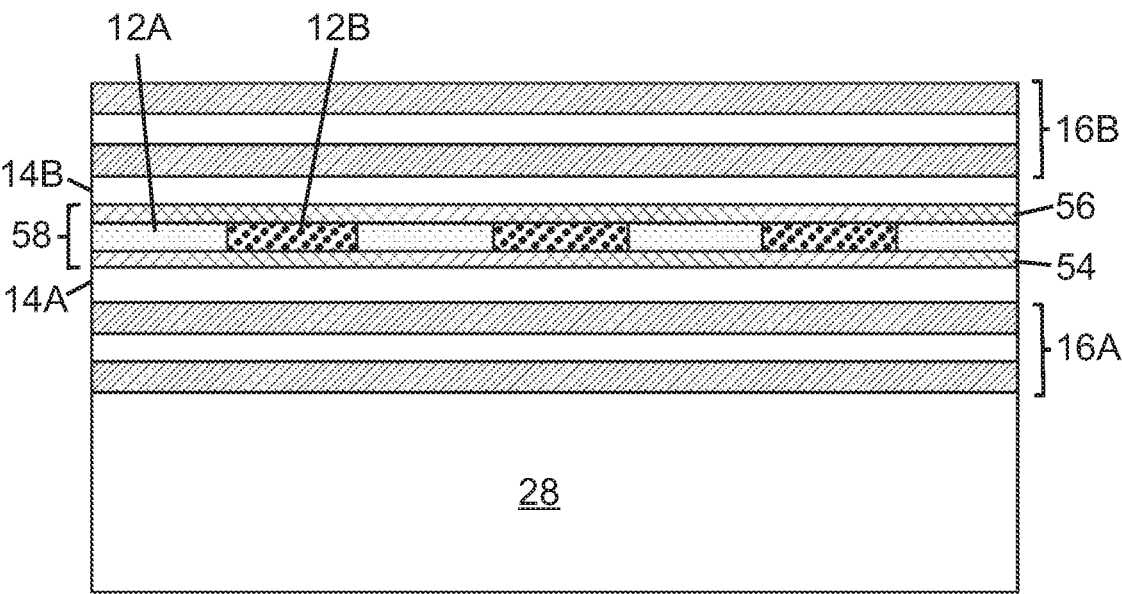
FIG. 19 is a side cross-sectional view of a MEMS guided wave device including a PPT having electrode layers sandwiching a piezoelectric layer with alternating polarity regions, and further including slow wave propagation layers sandwiching the PPT, first and second Bragg mirrors serving as a two-sided guided wave confinement structure, and a carrier substrate according to one embodiment of the present disclosure.

FIG. 19 illustrates a MEMS guided wave device substantially similar to the device of FIG. 18, except that Bragg mirrors are used instead of fast wave propagation layers as the first and second guided wave confinement structures 16A, 16B. Fabrication of the device of FIG. 19 is substantially similar to fabrication of the device of FIG. 18.

Figure 20:
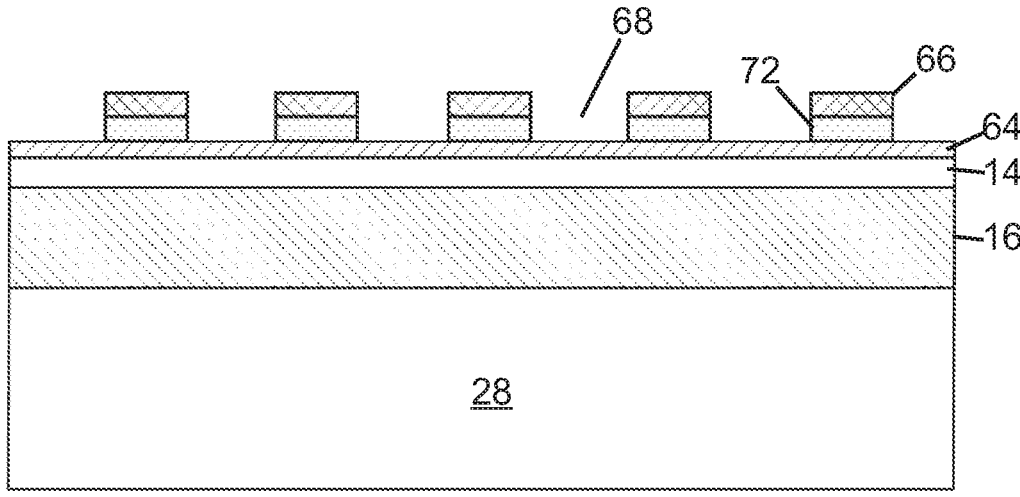
FIG. 20 is a side cross-sectional view of a MEMS guided wave device including a segmented piezoelectric layer arranged between a continuous electrode and a segmented electrode registered with the piezoelectric layer, with the device including a slow wave propagation layer, a fast wave propagation layer serving as a one-sided wave confinement structure, and a carrier substrate according to one embodiment of the present disclosure.

FIG. 20 illustrates a MEMS guided wave device including a segmented single crystal piezoelectric layer 72 arranged between a continuous electrode layer 64 and a segmented electrode layer 66 including electrode segments substantially registered with segments of the piezoelectric layer 72. The device includes an optional slow wave propagation layer 14, including a fast wave propagation layer serving as a one-sided wave confinement structure 16, and including an optional carrier substrate 28 according to one embodiment of the present disclosure. Segmentation of the segmented piezoelectric layer 72 and segmentation of the segmented electrode 66 yields gaps 68 between the segmented structures, and such segmentation is preferably performed after the MEMS guided wave device is formed to facilitate registration of the respective features. The electrode layers 64, 66 are asymmetrically arranged relative to a center of the segmented piezoelectric layer 72. To fabricate the MEMS guided wave device of FIG. 20, the guided wave confinement structure 16, the optional slow wave propagation layer 14, and the continuous electrode layer 64 may be deposited over the substrate 28 to form a lower subassembly. Thereafter, an appropriately planarized and polished piezoelectric wafer is bonded to the lower subassembly. An upper surface of the piezoelectric layer may be thinned and polished, followed by deposition of an upper electrode layer. Thereafter, apertures may be formed in the upper electrode layer and the piezoelectric layer (e.g., via one or more photolithographic etching steps) to form segments of the segmented electrode layer 66 that are substantially registered with segments of the segmented piezoelectric layer 72. The guided wave device of FIG. 20 may be used to generate a mixed wave that includes a vertical component as well as a transverse component.

Figure 21:
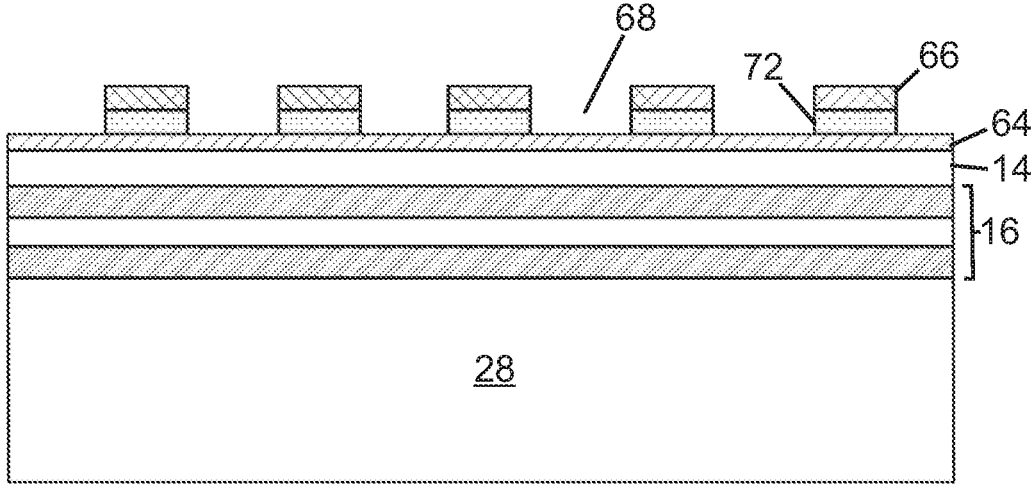
FIG. 21 is a side cross-sectional view of a MEMS guided wave device including a segmented piezoelectric layer arranged between a continuous electrode and a segmented electrode registered with the piezoelectric layer, with the device including a slow wave propagation layer, including a Bragg mirror serving as a one-sided wave confinement structure, and including a carrier substrate according to one embodiment of the present disclosure.

FIG. 21 illustrates a MEMS guided wave device substantially similar to the device of FIG. 20, except that a Bragg mirror is used instead of a fast wave propagation layer as a guided wave confinement structure 16. Fabrication of the device of FIG. 21 is substantially similar to fabrication of the device of FIG. 20.

In alternate embodiments, the MEMS guided wave devices of FIGS. 20 and 21 may be modified to at least partially fill (e.g., flush-fill in certain instances) gaps 68 between segments of the segmented electrode layer 66 and the segmented piezoelectric layer 72. Additionally, or alternatively, in certain embodiments the MEMS guided wave devices of FIGS. 20 and 21 may be modified to replace the continuous electrode layer 64 with a (second) segmented electrode layer, to thereby provide symmetric arrangement between the electrodes and a center thickness of the piezoelectric layer.

Figure 22:
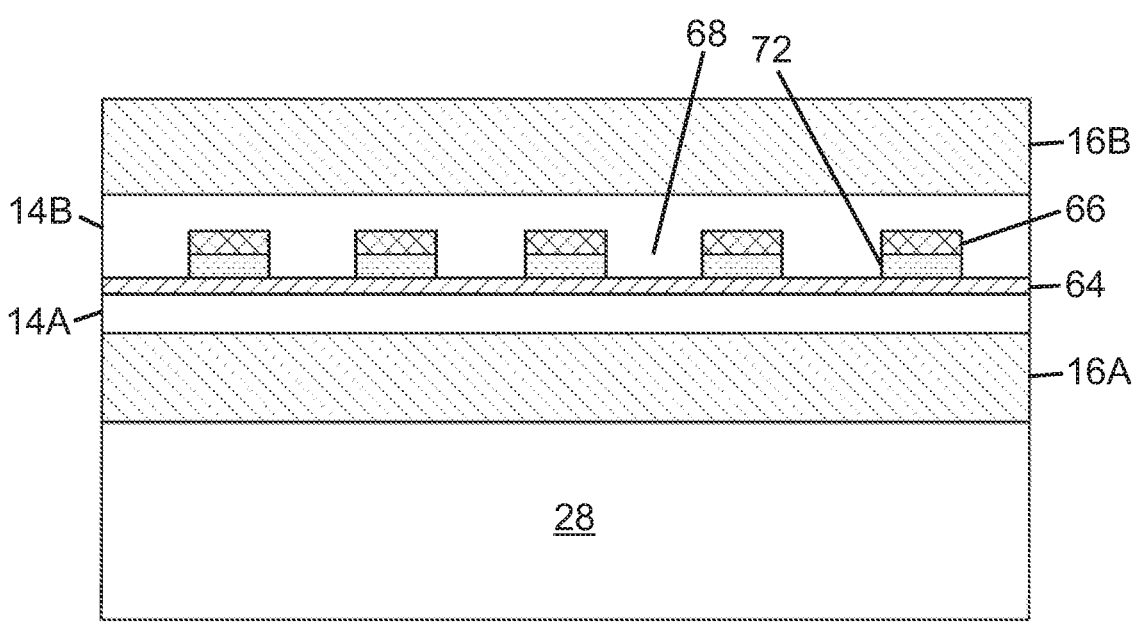
FIG. 22 is a side cross-sectional view of a MEMS guided wave device including a segmented piezoelectric layer arranged between a continuous electrode and a segmented electrode registered with the piezoelectric layer, with the device including slow wave propagation material (i) between the segmented piezoelectric layer and the segmented electrode, and (ii) sandwiching the electrodes, including fast wave propagation layers serving as a two-sided wave confinement structure, and including a carrier substrate according to one embodiment of the present disclosure.

FIG. 22 illustrates a MEMS guided wave device with a continuous electrode layer 64 and a segmented electrode layer 66 including electrode segments substantially registered with segments of the piezoelectric layer 72 similar to the device of FIG. 21, but with addition of double sided confinement. The device of FIG. 22 includes a segmented single crystal piezoelectric layer 72 arranged between a continuous electrode layer 64 and a segmented electrode layer 66 including segments substantially registered with segments of the piezoelectric layer 72, with the device including optional slow wave propagation layers 14A, 14B sandwiching the electrode layers 64, 66 and the piezoelectric layer 72, and with gaps 68 between respective segments of the segmented electrode layer 66 and the segmented piezo-electric layer 72 being at least partially filled (preferably completely filled) with slow wave propagation material of the second slow wave propagation layer 14B. Additionally, first and second fast wave propagation layers serving as first and second guided wave confinement structures 16A, 16B provide two-sided confinement. An optional substrate 28 is disposed under the first guided wave confinement structure 16A. The electrode layers 64, 66 are asymmetrically arranged relative to a center thickness of the piezoelectric layer 72. Fabrication of a lower portion of the MEMS guided wave device of FIG. 22 proceeds according to the steps employed in fabricating the device of FIG. 20, with the additional steps of depositing the second slow wave propa-gation layer 14B over and between the segmented electrode layer 66 and the segmented piezoelectric layer 72, followed by depositing the second guided wave confinement structure 16B over the second slow wave propagation layer 14B.

Figure 23:
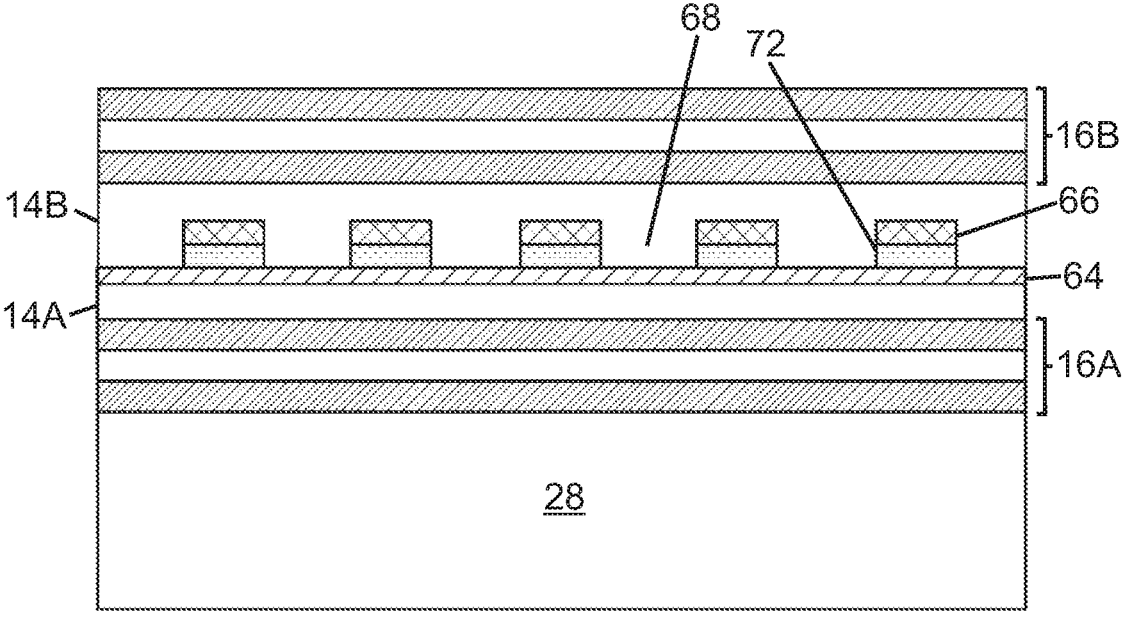
FIG. 23 is a side cross-sectional view of a MEMS guided wave device including a segmented piezoelectric layer arranged between a continuous electrode and a segmented electrode registered with the piezoelectric layer, with the device including slow wave propagation material (i) between the segmented piezoelectric layer and the segmented electrode, and (ii) sandwiching the electrodes, including Bragg mirrors serving as a two-sided wave confinement structure, and including a carrier substrate according to one embodiment of the present disclosure.

FIG. 23 illustrates a MEMS guided wave device substan-tially similar to the device of FIG. 22, except that Bragg mirrors are used instead of fast wave propagation layers as the first and second guided wave confinement structures 16A, 16B. Fabrication of the device of FIG. 23 is substan-tially similar to fabrication of the device of FIG. 22. Although FIGS. 22 and 23 depict MEMS guided wave devices with two-sided confinement, in alternative embodi-ments the second (top) side confinement structure 16B may be omitted, optionally in combination with omission of the second slow wave propagation layer 14B. Additionally, although FIGS. 20 to 23 illustrate a continuous electrode layer 64, in alternative embodiments, such layers 64 may be replaced with discontinuous (e.g., segmented) electrodes.

Figure 24:
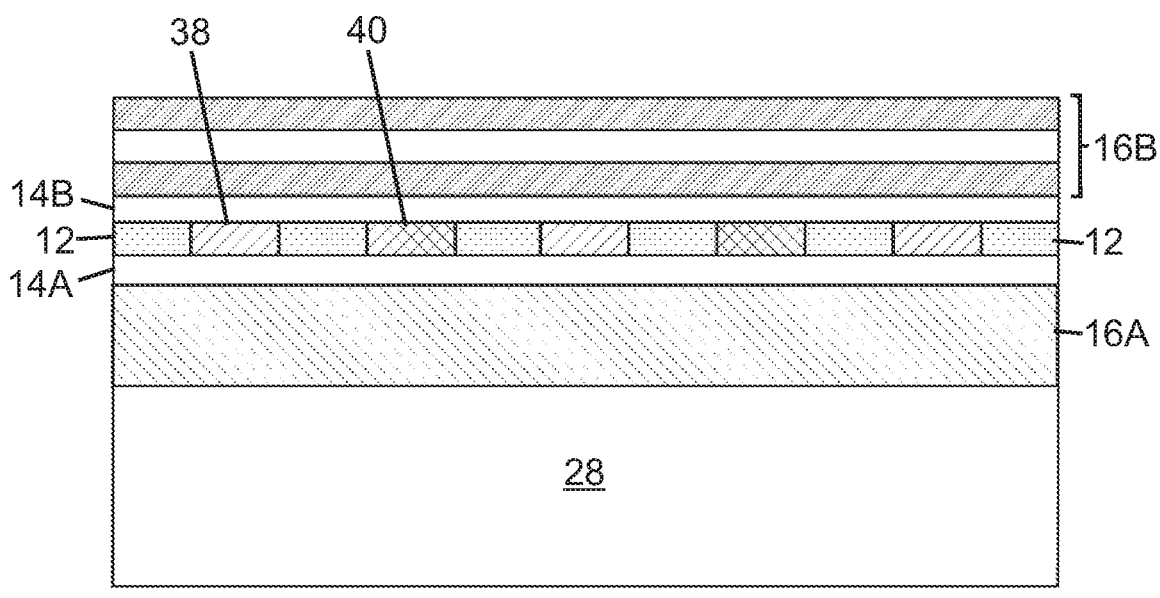
FIG. 24 is a side cross-sectional view of a MEMS guided wave device including electrodes in the form of an IDT embedded in and extending through the entire thickness of a piezoelectric layer, with slow wave propagation layers sandwiching the electrodes and the piezoelectric layer, with two-sided guided wave confinement provided by a fast wave propagation layer arranged below the piezoelectric layer and a Bragg mirror arranged above the piezoelectric layer, and with a carrier substrate according to one embodiment of the present disclosure.
Figure 25:
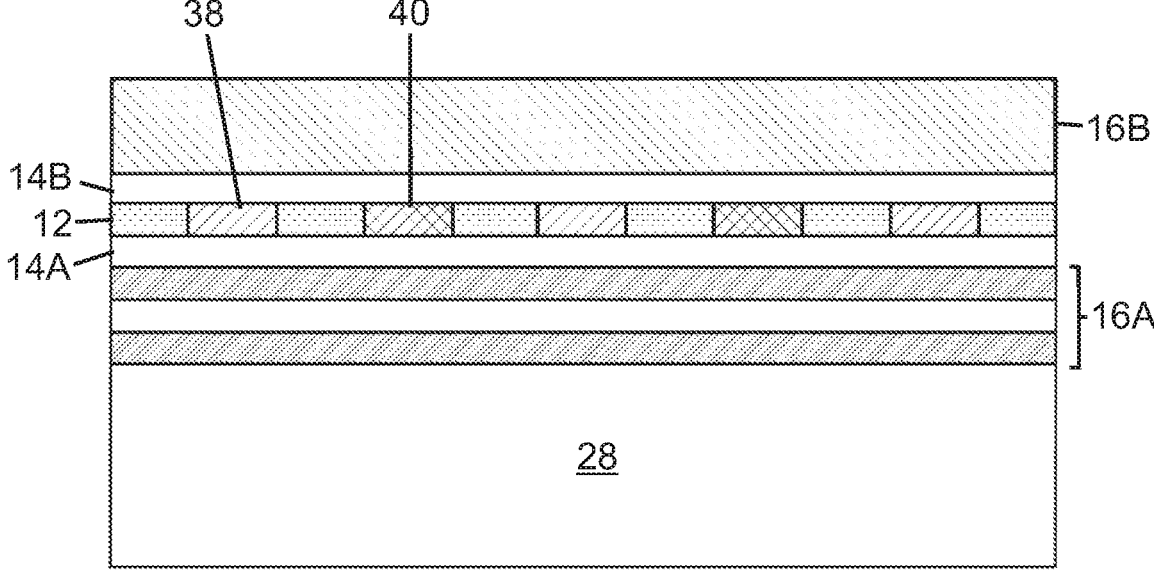
FIG. 25 is a side cross-sectional view of a MEMS guided wave device including electrodes in the form of an IDT embedded in and extending through the entire thickness of a piezoelectric layer, with slow wave propagation layers sandwiching the electrodes and the piezoelectric layer, with two-sided guided wave confinement provided by a Bragg mirror arranged below the piezoelectric layer and a fast wave propagation layer arranged above the piezoelectric layer, and with a carrier substrate according to one embodiment of the present disclosure.

FIGS. 24 and 25 illustrate MEMS guided wave devices substantially similar to the devices of FIGS. 12 and 13, except that double sided confinement is provided by guided wave confinement structures 16A, 16B of mixed types. FIG. 24 illustrates a MEMS guided wave device including elec-trodes 38, 40 in the form of an IDT embedded in and extending through the entire thickness of a single crystal piezoelectric layer 12, with slow wave propagation layers 14A, 14B sandwiching the electrodes 38, 40 and the piezo-electric layer 12. Two sided guided wave confinement is provided by a fast wave propagation layer serving as first guided wave confinement structure 16A arranged below the piezoelectric layer 12, and by a Bragg mirror serving as a second guided wave confinement structure 16B arranged above the piezoelectric layer 12. Slow wave propagation layers 14A, 14B are additionally provided between the respective guided wave confinement structures 16A, 16B and the piezoelectric layer 12. An optional substrate 28 is disposed under the first guided wave confinement structure 16A. The electrodes 38, 40 are symmetrically arranged relative to a center thickness of the piezoelectric layer 12. FIG. 25 is substantially similar to FIG. 24, except that two sided guided wave confinement is provided by a Bragg mirror serving as first guided wave confinement structure 16A arranged below the piezoelectric layer 12, and by a fast wave propagation layer serving as a second guided wave confinement structure 16B arranged above the piezoelectric layer 12. Fabrication of the MEMS guided wave devices is substantially similar to the fabrication steps described in connection with FIGS. 12 and 13, followed by deposition of a second slow wave propagation layer 14B and a second guided wave confinement structure 16B over the piezoelec-tric layer 12. Although FIGS. 24 and 25 depict MEMS guided wave devices with two-sided confinement, in alter-native embodiments the second (top) side confinement struc-ture 16B may be omitted, optionally in combination with omission of the second slow wave propagation layer 14B.

Although specific embodiments with two sided confine-ment illustrated in the drawings may include first and second (e.g., lower and upper) guided wave confinement structures of the same type (e.g., both being fast wave propagation layers or both being Bragg mirrors), it is specifically con-templated that any embodiments illustrated herein may be modified to include guided wave confinement structures 16A, 16B of mixed types. For example, a Bragg mirror may be provided below a piezoelectric layer and a fast wave propagation layer may be provided above a piezoelectric layer, or vice-versa, to provide two sided confinement.

In certain embodiments, electrodes may be arranged along different planes on surfaces of a piezoelectric layer, with one group of electrodes arranged within recesses defined in the piezoelectric layer. By recessing alternate electrodes, the periodicity can be reduced by half, thereby enabling higher operating frequencies. Additionally, by bringing electrodes of opposing polarity very close to one another, stronger acoustic wave excitation may be possible. If depth of the recesses defined in the piezoelectric layer is controlled, then spurious response may be controlled. In certain embodiments, some or all electrodes alternately defined on an upper surface and in recesses of a piezoelectric layer may be at least partially covered with functional layer (e.g., a temperature compensation material or a slow wave propagation material) having either a planar or an undulating top surface. In certain embodiments, such a functional material may provide temperature compensation utility. MEMS guided wave confinement devices including non-coplanar electrodes incorporating recessed electrodes are described in connection with FIGS. 26 to 29.

Figure 26:
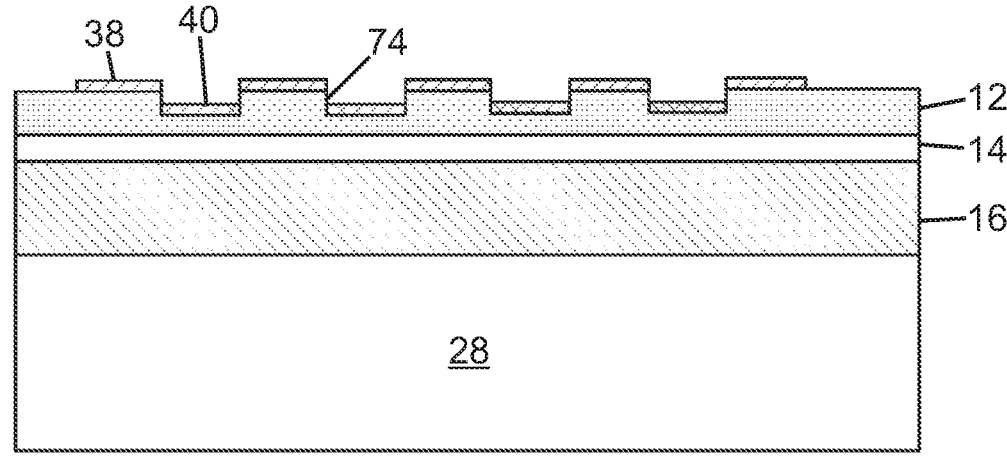
FIG. 26 is a side cross-sectional view of a MEMS guided wave device including electrodes in the form of an IDT with certain electrodes deposited in recesses defined in a piezoelectric layer and other electrodes deposited atop the piezoelectric layer, with the device further including a slow wave propagation layer, one-sided guided wave confinement provided by a fast wave propagation layer, and a carrier substrate according to one embodiment of the present disclosure.

FIG. 26 illustrates a MEMS guided wave device including a piezoelectric layer 12 defining multiple recesses 74, with electrodes 38, 40 in the form of an IDT deposited on the piezoelectric layer 12. A first group of electrodes 38 is arranged on an uppermost surface of the piezoelectric layer 12, and a second group of electrodes 40 is arranged in the recesses 74, such that the first group of electrodes 38 is non-coplanar with the second group of electrodes 40. The MEMS guided wave device of FIG. 26 further includes an optional slow wave propagation layer 14 below the piezo-electric layer 12, and fast wave propagation layer serving as a one sided guided wave confinement structure 16. An optional substrate 28 is disposed under the guided wave confinement structure 16. The electrodes 38, 40 are asym-metrically arranged relative to a center thickness of the piezoelectric layer 12. To fabricate the MEMS guided wave device of FIG. 26, a lower subassembly including the substrate 28, the guided wave confinement structure 16, and the slow wave propagation layer 14 may be produced by sequential deposition steps. Following planarization and polishing of the slow wave propagation layer 14, a prefab-ricated single crystal piezoelectric wafer may be directly bonded to the lower subassembly. The piezoelectric wafer may be processed (e.g., via grinding and polishing) to a desired thickness. Thereafter, recesses may be defined in the piezoelectric wafer by any suitable technique, such as ion milling, and metal may be deposited (e.g., via evaporative deposition) to form recessed electrodes 40 and non-recessed electrodes 38.

Figure 27:
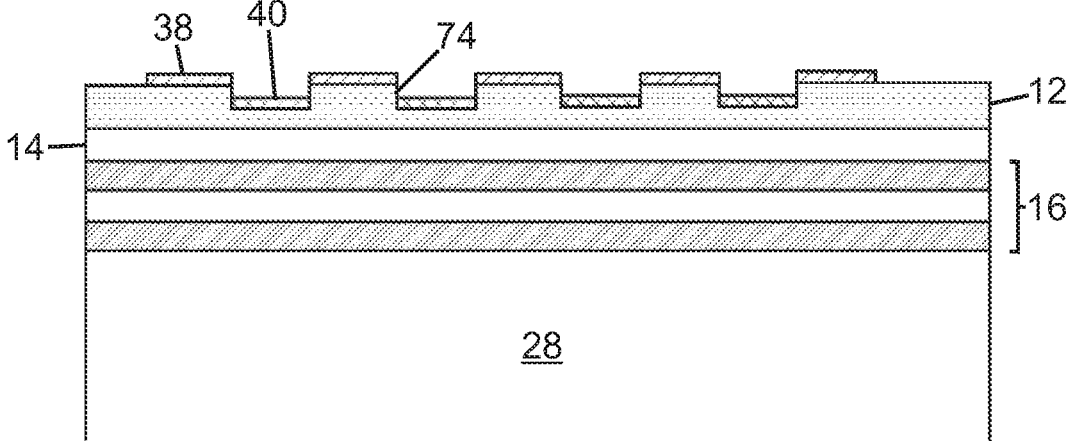
FIG. 27 is a side cross-sectional view of a MEMS guided wave device including electrodes in the form of an IDT with certain electrodes deposited in recesses defined in a piezoelectric layer and other electrodes deposited atop the piezoelectric layer, with the device further including a slow wave propagation layer, one-sided guided wave confinement provided by a Bragg mirror, and a carrier substrate according to one embodiment of the present disclosure.

FIG. 27 illustrates a MEMS guided wave device substantially similar to the device of FIG. 26, except that a Bragg mirror is used instead of a fast wave propagation layer as a guided wave confinement structure 16. Fabrication of the device of FIG. 27 is substantially similar to fabrication of the device of FIG. 26.

Figure 28:
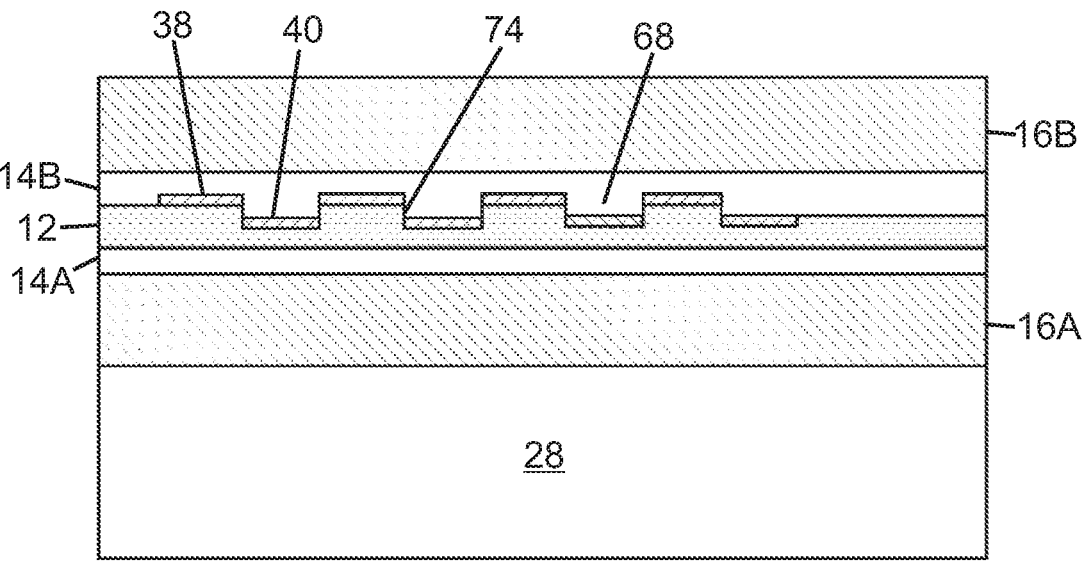
FIG. 28 is a side cross-sectional view of a MEMS guided wave device including electrodes in the form of an IDT with certain electrodes deposited in recesses defined in a piezoelectric layer and other electrodes deposited atop the piezoelectric layer, with slow wave propagation layers sandwiching the electrodes and the piezoelectric layer, with two-sided guided wave confinement provided by fast wave propagation layers arranged above and below the slow wave propagation layers, and with a carrier substrate according to one embodiment of the present disclosure.
Figure 29:
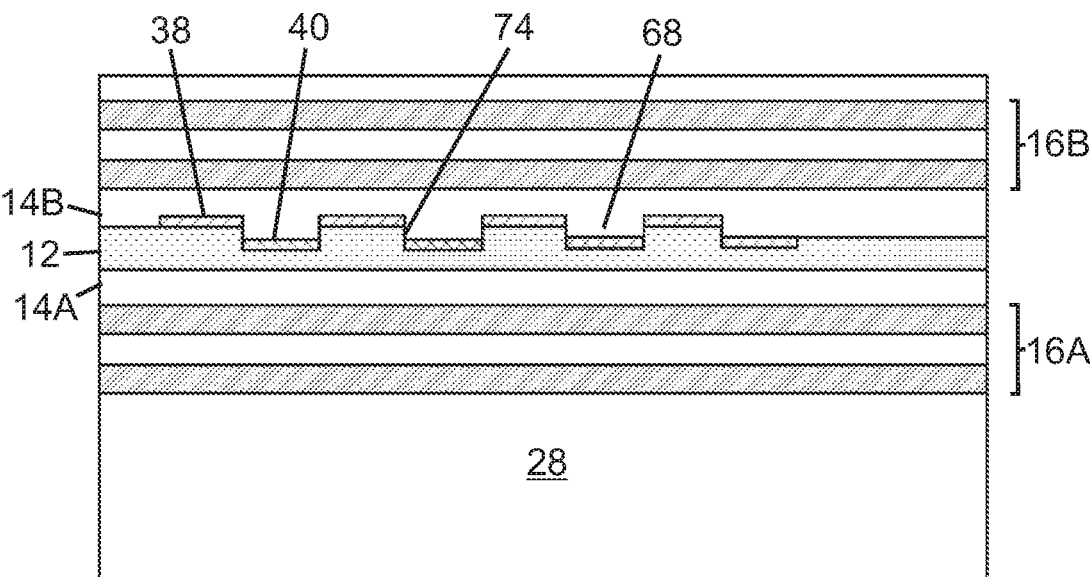
FIG. 29 is a side cross-sectional view of a MEMS guided wave device including electrodes in the form of an IDT with certain electrodes deposited in recesses defined in a piezoelectric layer and other electrodes deposited atop the piezoelectric layer, with slow wave propagation layers sandwiching the electrodes and the piezoelectric layer, with two-sided guided wave confinement provided by Bragg mirrors arranged above and below the slow wave propagation layers, and with a carrier substrate according to one embodiment of the present disclosure.

FIGS. 28 and 29 illustrate MEMS guided wave devices similar to the devices of FIGS. 26 and 27, but with addition of double sided confinement.

The MEMS guided wave device of FIG. 28 includes a piezoelectric layer 12 defining multiple recesses 74, with electrodes 38, 40 in the form of an IDT deposited on the piezoelectric layer 12. A first group of electrodes 38 is arranged on a bulk upper surface of the piezoelectric layer 12, and a second group of electrodes 40 is arranged in the recesses 74, such that the first group of electrodes 38 is non-coplanar with the second group of electrodes 40. Optional slow wave propagation layers 14A, 14B sandwich the piezoelectric layer 12 and the electrodes 38, 40, with portions of the second slow wave propagation layer 14B further filling gaps 68 above electrodes 40 and between electrodes 38. Additionally, first and second fast wave propagation layers serving as first and second guided wave confinement structures 16A, 16B provide two-sided confinement and sandwich the slow wave propagation layers 14A, 14B. An optional substrate 28 is disposed under the first guided wave confinement structure 16A. The electrodes 38, 40 are asymmetrically arranged relative to a center thickness of the piezoelectric layer 12. Fabrication of a lower portion of the MEMS guided wave device of FIG. 28 proceeds according to the steps employed in fabricating the device of FIG. 26, with the additional steps of depositing the second slow wave propagation layer 14B and the second guided wave confinement structure 16B over the electrodes 38, 40 and the piezoelectric layer 12.

FIG. 29 illustrates a MEMS guided wave device substantially similar to the device of FIG. 28, except that Bragg mirrors are used instead of fast wave propagation layers as the first and second guided wave confinement structures 16A, 16B. Fabrication of the device of FIG. 29 is substantially similar to fabrication of the device of FIG. 28. Although FIGS. 28 and 29 depict MEMS guided wave devices with two-sided confinement, in alternative embodiments the second (top) side confinement structure 16B may be omitted, optionally in combination with omission of the second slow wave propagation layer 14B.

In alternate embodiments, the MEMS guided wave devices of FIGS. 28 and 29 may be modified to include mixed types of guided wave confinement structures 16A, 16B, such as a Bragg mirror arranged below a piezoelectric layer and a fast wave propagation layer arranged above a piezoelectric layer, or vice-versa.

In certain embodiments, a MEMS guided wave device includes differing first and second thickness regions, a first group of electrodes arranged on or adjacent to the first thickness region and configured for transduction of a first lateral acoustic wave having a wavelength $\lambda_1$ in the first thickness region, and a second group of electrodes arranged on or adjacent to the second thickness region and configured for transduction of a second lateral acoustic wave having a wavelength $\lambda_2$ in the second thickness region, wherein $\lambda_1$ differs from $\lambda_2$. At least one guided wave confinement structure is configured to confine the first lateral acoustic wave in the first thickness region, and configured to confine the second lateral acoustic wave in the second thickness region. In this manner, multiple resonators of a single device may be used for transduction of multiple widely different (e.g., octave difference) frequencies. Examples of multi-frequency MEMS guided wave devices are illustrated in FIGS. 30-36.

Figure 30:
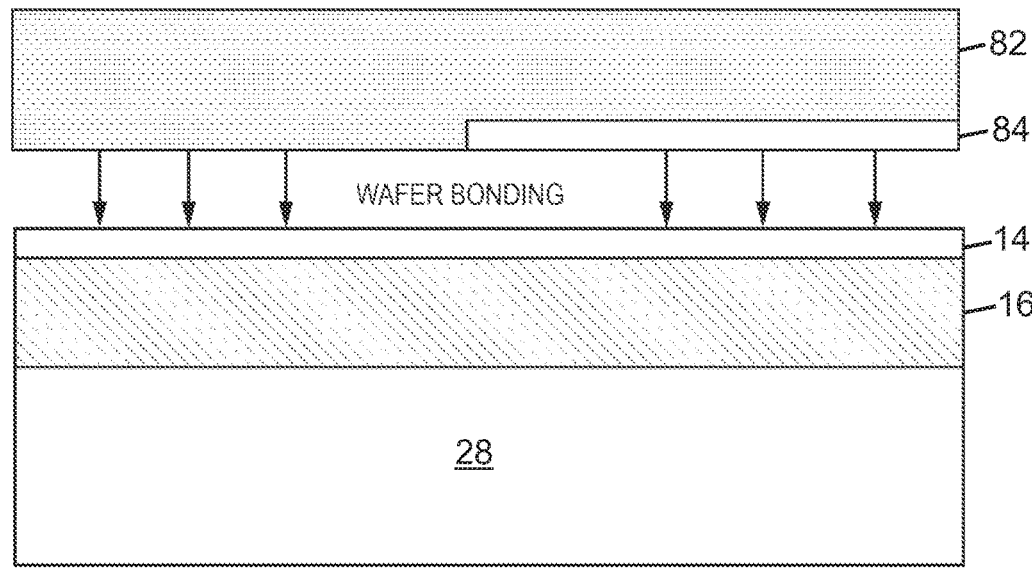
FIG. 30 is a side cross-sectional view of subassemblies of a MEMS guided wave device during fabrication, following local thinning of a piezoelectric layer to define first and second thickness regions with a thinner region filled with a temperature compensation material, and prior to wafer bonding of the piezoelectric layer to a subassembly including a temperature compensation layer arranged over a fast wave propagation layer and a carrier substrate according to one embodiment of the present disclosure.

FIG. 30 illustrates subassemblies of a MEMS guided wave device during fabrication, following local thinning of a piezoelectric layer 82 prior to direct bonding of the piezoelectric layer to an underlying layer. In FIG. 30, a lower subassembly includes a substrate 28, a fast wave propagation layer serving as a guided wave confinement structure 16 arranged over the substrate 28, and a temperature compensation layer 14 arranged over the guided wave confinement structure 16. An upper subassembly includes a piezoelectric wafer that has been locally thinned (e.g., via an appropriate technique such as ion milling or etching) to yield first and second thickness regions, wherein a thinner of the two regions is filled with a temperature compensation material 84. After formation of the lower and upper subassemblies, mating surfaces may be processed (e.g., via planarization and polishing) and directly bonded. Thereafter, thickness of the piezoelectric layer 82 may be adjusted by grinding and polishing the upper surface, and electrodes may be deposited over the piezoelectric layer.

Figure 31:
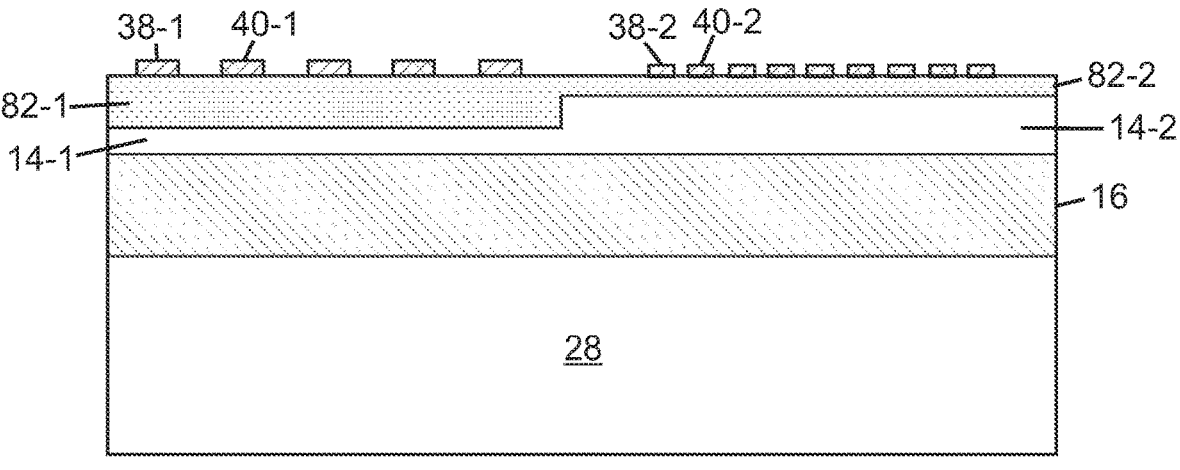
FIG. 31 is a side cross-sectional view of a MEMS guided wave device produced with the subassemblies illustrated in FIG. 30, following wafer bonding, planarization/thinning of an outer surface of the piezoelectric layer, and deposition of substantially coplanar first and second groups of electrodes over first and second thickness regions, respectively, of the piezoelectric layer, according to one embodiment of the present disclosure.

FIG. 31 illustrates a MEMS guided wave device produced with the subassemblies illustrated in FIG. 30, following wafer bonding, planarization/thinning of an outer surface of the piezoelectric layer (to yield a first thickness region 82-1 and a second thickness region 82-2 of the piezoelectric layer) and deposition of electrodes 38-1, 40-1, 38-2, 40-2 over the piezoelectric layer. A first group of electrodes 38-1, 40-1 (e.g., forming a first IDT) is arranged over the first thickness region 82-1, and a second group of electrodes 38-2, 40-2 (e.g., forming a second IDT) is arranged over the second thickness region 82-2, with all electrodes 38-1, 40-1, 38-2, 40-2 being substantially coplanar and arranged to asymmetric guided wave excitation. As shown in FIG. 31, a periodicity (or spacing) of electrodes within the first group of electrodes 38-1, 40-1 preferably differs from a periodicity of electrodes within the second group of electrodes 38-2, 40-2. Through addition of the temperature compensation material 84 of the upper subassembly (shown in FIG. 30) to the temperature compensation layer 14 of the lower subassembly, the resulting MEMS guided wave device includes a first temperature compensation layer thickness region 14-1 and a second temperature compensation layer thickness region 14-2, wherein each such region 14-1, 14-2 has a different thickness. In operation of the MEMS guided wave device of FIG. 31, laterally excited waves are stimulated in the first and second thickness regions 82-1, 82-2 of the piezoelectric layer using the first group of electrodes 38-1, 40-1 and the second group of electrodes 38-2, 40-2, respectively, and the guided wave confinement structure 16 (i.e., fast wave propagation layer) serves to confine the laterally excited waves in the first and second thickness regions 82-1, 82-2.

Figure 32:
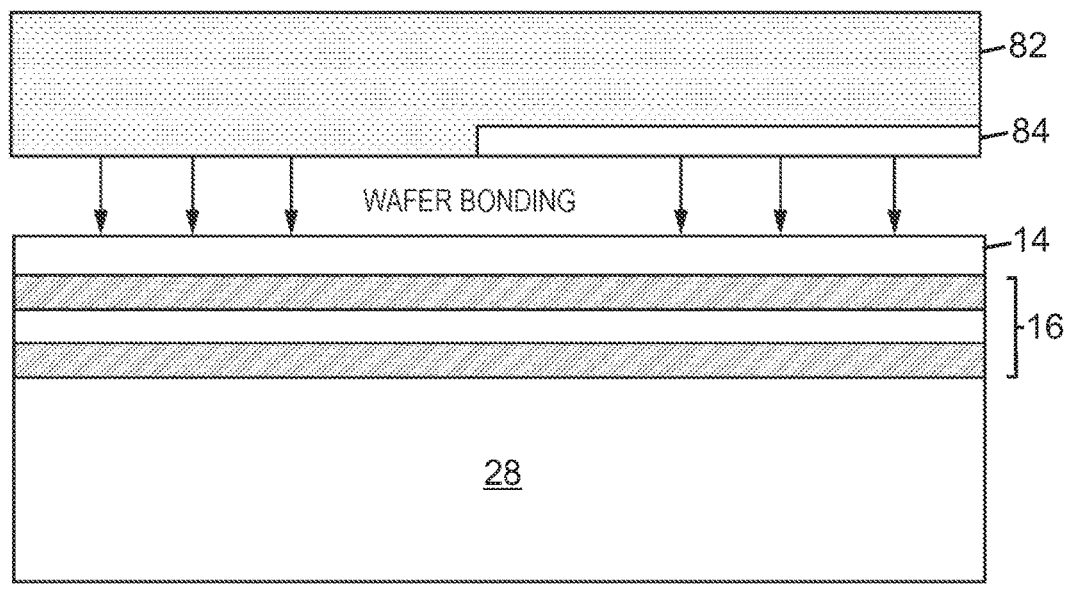
FIG. 32 is a side cross-sectional view of subassemblies of a MEMS guided wave device during fabrication, following local thinning of a piezoelectric layer to define first and second thickness regions with a thinner region filled with a temperature compensation material, and prior to wafer bonding of the piezoelectric layer to a subassembly including a temperature compensation layer arranged over a Bragg mirror and a carrier substrate according to one embodiment of the present disclosure.
Figure 33:
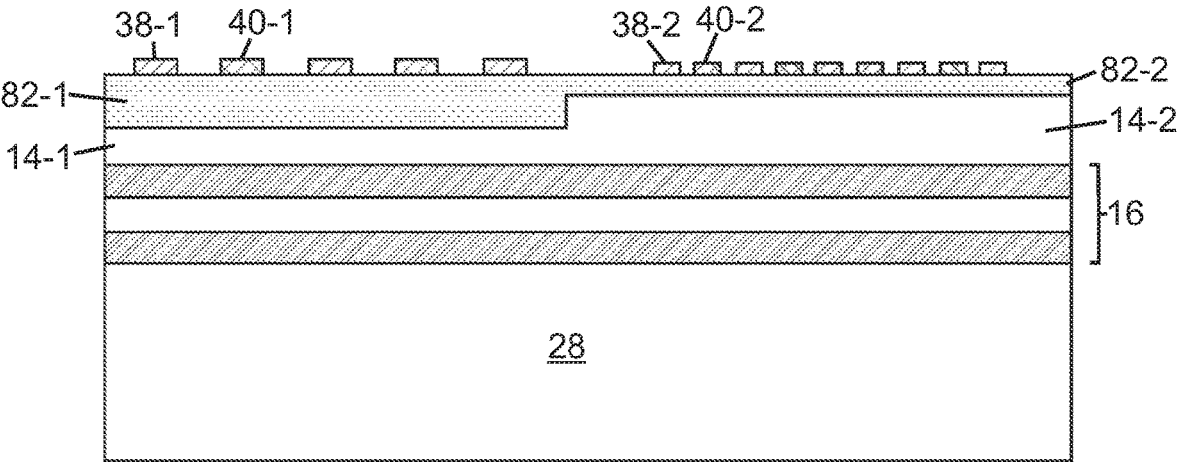
FIG. 33 is a side cross-sectional view of a MEMS guided wave device produced with the subassemblies illustrated in FIG. 32, following wafer bonding, planarization/thinning of an outer surface of the piezoelectric layer, and deposition of substantially coplanar first and second groups of electrodes over first and second thickness regions, respectively, of the piezoelectric layer, according to one embodiment of the present disclosure

FIGS. 32 and 33 are substantially similar to FIGS. 30 and 31, except that a Bragg mirror is provided instead of a fast wave propagation layer as the guided wave confinement structure 16. Fabrication of the MEMS guided wave confinement structure of FIG. 33 is substantially similar to the fabrication steps described in connection with the MEMS guided wave confinement structure of FIG. 31, except for replacement of the fast wave propagation layer with a Bragg mirror to serve as the guided wave confinement structure 16.

Figure 34:
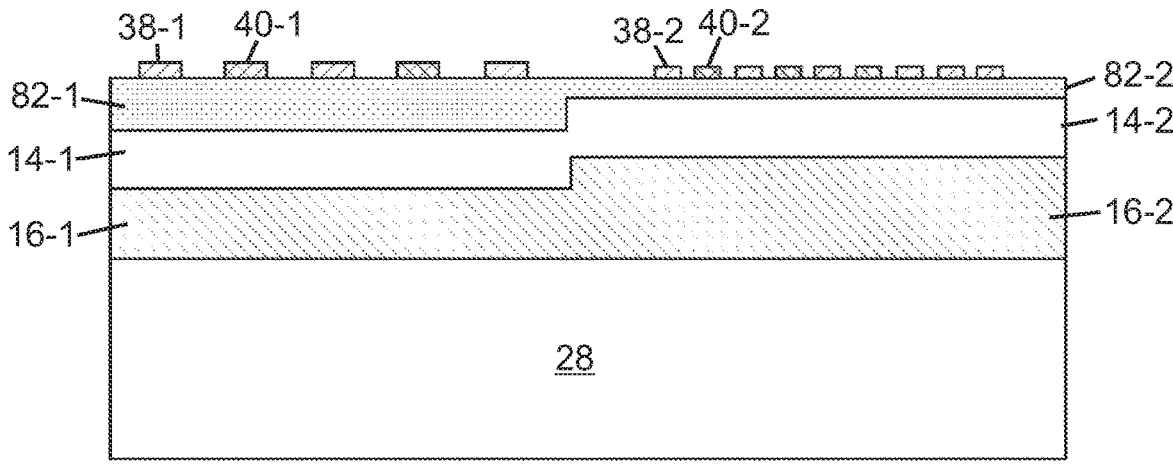
FIG. 34 is a side cross-sectional view of a MEMS guided wave device including substantially coplanar first and second groups of electrodes arranged over first and second thickness regions, respectively, of a piezoelectric layer, which is arranged over a temperature compensation layer having first and second temperature compensation layer thicknesses underlying the first and second thickness regions of the piezoelectric layer, respectively, which is arranged over a fast wave propagation layer having first and second fast wave propagation layer thicknesses underlying the first and second temperature compensation layer thickness regions and providing guided wave confinement utility, and which is arranged over a carrier substrate according to one embodiment of the present disclosure.

FIG. 34 illustrates a MEMS guided wave device including first and second thickness regions 82-1, 82-2 of a piezoelectric layer that are overlaid with a first group of electrodes 38-1, 40-1 and a second group of electrodes 38-2, 40-2, respectively. Each group of electrodes 38-1, 40-1, 38-2, 40-2 is substantially coplanar. The first and second thickness regions 82-1, 82-2 of the piezoelectric layer overlie a temperature compensation layer including a first temperature compensation layer thickness region 14-1 and a second temperature compensation layer thickness region 14-2. Thereunder, a guided wave confinement structure 16 in the form of a fast wave propagation material including a first guided wave confinement thickness region 16-1 and a second guided wave confinement thickness region 16-2 is provided. The guided wave confinement structure 16 may optionally be supported by an underlying substrate 28. Ultimately, the first group of electrodes 38-1, 40-1 (e.g., forming a first IDT) is arranged over a first thickness region 82-1 of the piezoelectric layer, a first temperature compensation layer thickness region 14-1, and a first guided wave confinement thickness region 16-1. Similarly, the second group of electrodes 38-2, 40-2 (e.g., forming a second IDT) is arranged over a second thickness region 82-2 of the piezoelectric layer, a second temperature compensation layer thickness region 14-2, and a second guided wave confinement thickness region 16-2. In this manner, wave propagation characteristics, temperature compensation characteristics, and guided wave confinement characteristics may be selected for each of the first group of electrodes 38-1, 40-1 and the second group of electrodes 38-2, 40-2.

The MEMS guided wave device of FIG. 34 may be fabricated from multiple subassemblies. A lower subassembly may be formed by depositing a guided wave confinement structure (e.g., a fast wave propagation material) on a substrate 28, followed by locally thinning the guided wave confinement structure, depositing a temperature compensation material in the locally thinned area, and depositing further temperature compensation material over the entire surface. An upper subassembly may be formed by locally thinning a prefabricated piezoelectric wafer, and depositing temperature compensation material in the locally thinned area. After appropriate planarization and polishing of mating surfaces of the respective subassemblies, the upper and lower subassemblies may be directly bonded to one another. Thereafter, thickness of the piezoelectric layer 82 may be adjusted by grinding and polishing, and groups of electrodes 38-1, 40-1, 38-2, 40-2 may be deposited on an upper surface thereof.

Figure 35:
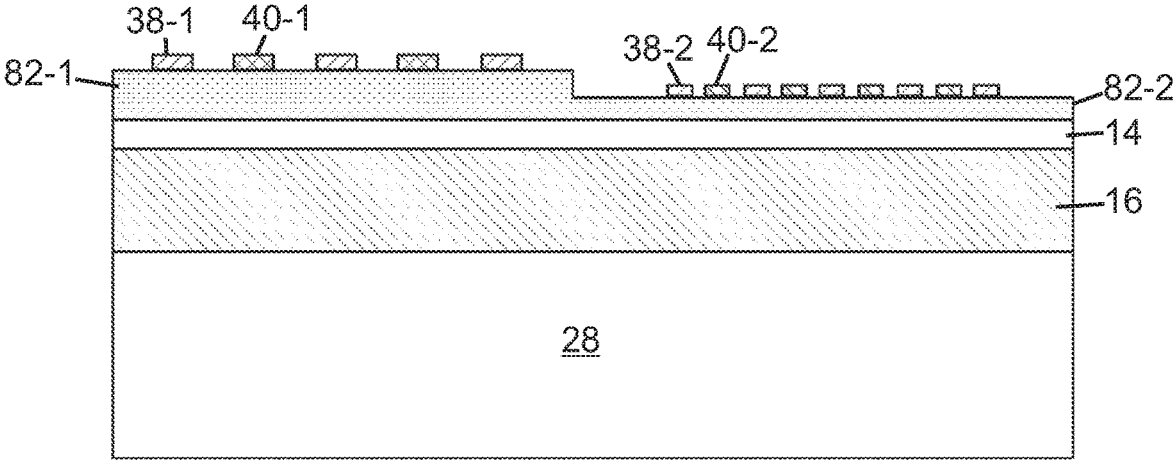
FIG. 35 is a side cross-sectional view of a MEMS guided wave device including non-coplanar first and second groups of electrodes arranged over non-coplanar upper surfaces bounding first and second thickness regions, respectively, of a piezoelectric layer, which is arranged over a temperature compensation layer, a fast wave propagation layer providing one-sided guided wave confinement utility, and a carrier substrate according to one embodiment of the present disclosure.
Figure 36:
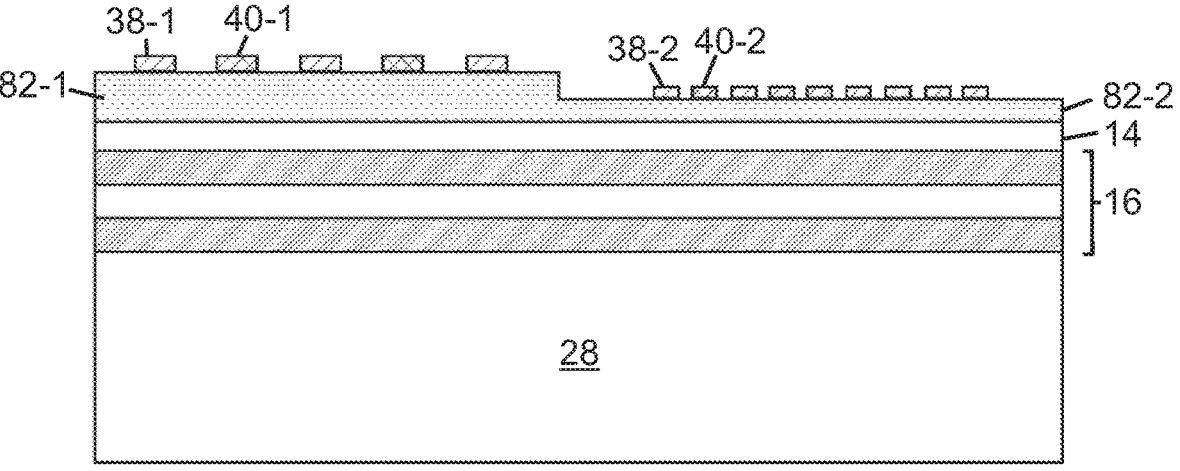
FIG. 36 is a side cross-sectional view of a MEMS guided wave device including non-coplanar first and second groups of electrodes arranged over non-coplanar upper surfaces bounding first and second thickness regions, respectively, of a piezoelectric layer, which is arranged over a temperature compensation layer, a Bragg mirror providing one-sided guided wave confinement utility, and a carrier substrate according to one embodiment of the present disclosure.

FIGS. 35 and 36 illustrate MEMS guided wave devices in which a piezoelectric layer includes different thickness regions with non-coplanar top surfaces over which different groups of electrodes are arranged. Referring to FIG. 35, a MEMS guided wave device includes first and second thickness regions 82-1, 82-2 of a piezoelectric layer that are overlaid with a first group of electrodes 38-1, 40-1 (e.g., forming a first IDT) and a second group of electrodes 38-2, 40-2 (e.g., forming a second IDT), respectively. Top surfaces of the first and second thickness regions 82-1, 82-2 are non-coplanar, such that the first group of electrodes 38-1, 40-1 is non-coplanar with the second group of electrodes 38-2, 40-2. The first and second thickness regions 82-1, 82-2 of the piezoelectric layer overlie a temperature compensation layer 14. Thereunder, a guided wave confinement structure 16 in the form of a fast wave propagation material is provided. The guided wave confinement structure 16 may optionally be supported by an underlying substrate 28. The MEMS guided wave device of FIG. 35 may be fabricated depositing a guided wave confinement structure 16 (e.g., a fast wave propagation material) on a substrate 28, and depositing a temperature compensation layer 14 over guided wave confinement structure 16. After appropriate planarization and polishing of a mating surface of the temperature compensation layer 14 and a mating surface of a prefabricated piezoelectric wafer, such surfaces may be directly bonded. Thereafter, the piezoelectric wafer may be locally thinned, such as by ion milling, to define the first and second thickness regions 82-1, 82-2, and groups of electrodes 38-1, 40-1 and 38-2, 40-2 may be deposited thereon.

Thus, a method of fabricating a micro-electrical-mechanical system (MEMS) guided wave device including a single crystal piezoelectric material with different thickness regions includes local thinning of a single crystal piezoelectric layer to define first and second thickness regions that differ in thickness. The locally thinned piezoelectric layer is bonded on or over an underlying layer (e.g., at least one of (i) a fast wave propagation layer; (ii) a Bragg mirror, or (iii) a substrate) to provide an internally bonded interface. Such bonding may be performed using wafer bonding techniques known in the art. First and second groups of electrodes are defined on or adjacent to the first thickness region and the second thickness region, respectively, for transduction of a first lateral acoustic wave having a first wavelength $\lambda_1$ in the first thickness region, and for transduction of a second lateral acoustic wave having a second wavelength $\lambda_2$ in the second thickness region. One or more surfaces of the piezoelectric layer may be planarized prior to bonding (e.g., as a bonding preparation step), and/or planarized after bonding (e.g., to adjust thickness of the piezoelectric layer). Preferably, a temperature compensation layer may be provided below the piezoelectric layer, wherein in certain embodiments, the temperature compensation layer may include a first temperature compensation layer thickness region and a second temperature compensation layer thickness that differ from one another. In certain embodiments, additional temperature compensation material may be deposited on or over a surface of at least one of the first thickness region or the second thickness region.

Upon reading the following description in light of the accompanying drawing figures, those skilled in the art will understand the concepts of the disclosure and will recognize applications of these concepts not particularly addressed herein. Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A method of fabricating a micro-electrical-mechanical system (MEMS) guided wave device, the method comprising:

locally thinning a single crystal piezoelectric material layer to define a first thickness region and a second thickness region, wherein a thickness of the first thickness region differs from a thickness of the second thickness region;

depositing a temperature compensation material on a surface of the first thickness region and on a surface of the second thickness region, wherein the temperature compensation material comprises a first temperature compensation layer thickness proximate to the first thickness region, the temperature compensation material comprises a second temperature compensation layer thickness proximate to the second thickness region, and the second temperature compensation layer thickness differs from the first temperature compensation layer thickness;

bonding the locally thinned single crystal piezoelectric material layer on or over an underlying layer to provide a bonded interface;

defining a first plurality of electrodes arranged on or adjacent to the first thickness region and configured for transduction of a lateral acoustic wave having a wavelength 21 in the first thickness region; and defining a second plurality of electrodes arranged on or adjacent to the second thickness region and configured for transduction of a lateral acoustic wave having a wavelength 22 in the second thickness region.

2. The method of claim 1, further comprising planarizing at least one surface of the single crystal piezoelectric material layer prior to the bonding of the locally thinned single crystal piezoelectric material layer on or over the underlying layer.

3. The method of claim 1, wherein the first plurality of electrodes comprises a first interdigital transducer, and the second plurality of electrodes defines a second interdigital transducer.

4. The method of claim 1, wherein the first plurality of electrodes is substantially coplanar with the second plurality of electrodes.

5. The method of claim 1, wherein the first plurality of electrodes is non-coplanar with the second plurality of electrodes.

6. The method of claim 1, wherein the underlying layer comprises at least one of a fast wave propagation layer or a Bragg mirror.

7. The method of claim 1, wherein the underlying layer comprises a substrate.

8. The method of claim 1, wherein the underlying layer comprises a substrate in combination with at least one of a fast wave propagation layer or a Bragg mirror, wherein the at least one of a fast wave propagation layer or a Bragg mirror is arranged between the substrate and the single crystal piezoelectric material layer.

9. A method of fabricating a micro-electrical-mechanical system (MEMS) guided wave device, the method comprising:

locally thinning a single crystal piezoelectric material layer to define a first thickness region and a second thickness region, wherein a thickness of the first thickness region is greater than a thickness of the second thickness region, the single crystal piezoelectric material layer comprises an upper surface and a lower surface that opposes the upper surface, and the local thinning of the single crystal piezoelectric material layer comprises removing material from the lower surface;

providing a temperature compensation material on a lower surface of the second thickness region, and not on a lower surface of the first thickness region;

bonding the locally thinned single crystal piezoelectric material layer on or over an underlying layer to provide a bonded interface;

defining a first plurality of electrodes on the upper surface on or adjacent to the first thickness region and configured for transduction of a lateral acoustic wave having a wavelength $\lambda_1$ in the first thickness region; and defining a second plurality of electrodes on the upper surface arranged on or adjacent to the second thickness region and configured for transduction of a lateral acoustic wave having a wavelength $\lambda_2$ in the second thickness region;

wherein the first plurality of electrodes is substantially coplanar with the second plurality of electrodes.

10. The method of claim 9, further comprising planarizing the upper surface of the single crystal piezoelectric material layer prior to the bonding of the locally thinned single crystal piezoelectric material layer on or over the underlying layer.

11. The method of claim 9, wherein the first plurality of electrodes comprises a first interdigital transducer, and the second plurality of electrodes defines a second interdigital transducer.

12. The method of claim 9, wherein the underlying layer comprises at least one of a fast wave propagation layer or a Bragg mirror.

13. The method of claim 9, wherein the underlying layer comprises a substrate.

14. The method of claim 9, wherein the underlying layer comprises a substrate in combination with at least one of a fast wave propagation layer or a Bragg mirror, wherein the at least one of a fast wave propagation layer or a Bragg mirror is arranged between the substrate and the single crystal piezoelectric material layer.

15. The method of claim 9, further comprising grinding and polishing the upper surface prior to the defining of the first plurality of electrodes and the defining of the second plurality of electrodes.

* * * * *